United States Patent
Hoel et al.

(10) Patent No.: US 12,074,600 B2
(45) Date of Patent: Aug. 27, 2024

(54) METHODS AND APPARATUS TO DYNAMICALLY CORRECT TIME KEEPING ERRORS

(71) Applicant: Texas Instruments Incorporated, Dallas, TX (US)

(72) Inventors: Robin Hoel, Oslo (NO); Anuvrat Srivastava, Bengaluru (IN); Aniruddha P N, Bangalore (IN); Anand Kumar G, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 56 days.

(21) Appl. No.: 17/949,446

(22) Filed: Sep. 21, 2022

(65) Prior Publication Data

US 2023/0188140 A1 Jun. 15, 2023

(30) Foreign Application Priority Data

Dec. 14, 2021 (IN) .............................. 202141058132

(51) Int. Cl.
- *H03K 21/10* (2006.01)
- *G06F 1/08* (2006.01)
- *G06F 1/10* (2006.01)

(52) U.S. Cl.
CPC ............... *H03K 21/10* (2013.01); *G06F 1/08* (2013.01); *G06F 1/10* (2013.01)

(58) Field of Classification Search
CPC .. H03K 21/10; G06F 1/08; G06F 1/10; G06F 1/12; G06F 1/14
USPC .......................................................... 327/115
See application file for complete search history.

(56) References Cited

U.S. PATENT DOCUMENTS

| | | | |
|---|---|---|---|
| 2002/0008775 A1* | 1/2002 | Kweon ................... | H04N 5/782 348/460 |
| 2005/0153751 A1* | 7/2005 | Bultan ................. | H04W 52/288 455/574 |
| 2008/0155608 A1* | 6/2008 | Han ....................... | H04H 60/27 725/132 |
| 2018/0270823 A1* | 9/2018 | Tanaka ................. | H04B 13/005 |
| 2023/0188140 A1* | 6/2023 | Hoel ........................ | G06F 1/12 327/115 |

* cited by examiner

*Primary Examiner* — Ryan Jager
(74) *Attorney, Agent, or Firm* — Brian D. Graham; Frank D. Cimino; Xianghui Huang

(57) ABSTRACT

An example apparatus includes clock divider circuitry configured to divide a system clock by a pre-scaler input to generate a divided clock; counter circuitry configured to increment a system count based on the divided clock; comparison circuitry configured to determine a count difference between the system count and a real-time clock count; and controller circuitry configured to modify the pre-scaler input based on a comparison of the count difference to a threshold value.

20 Claims, 10 Drawing Sheets

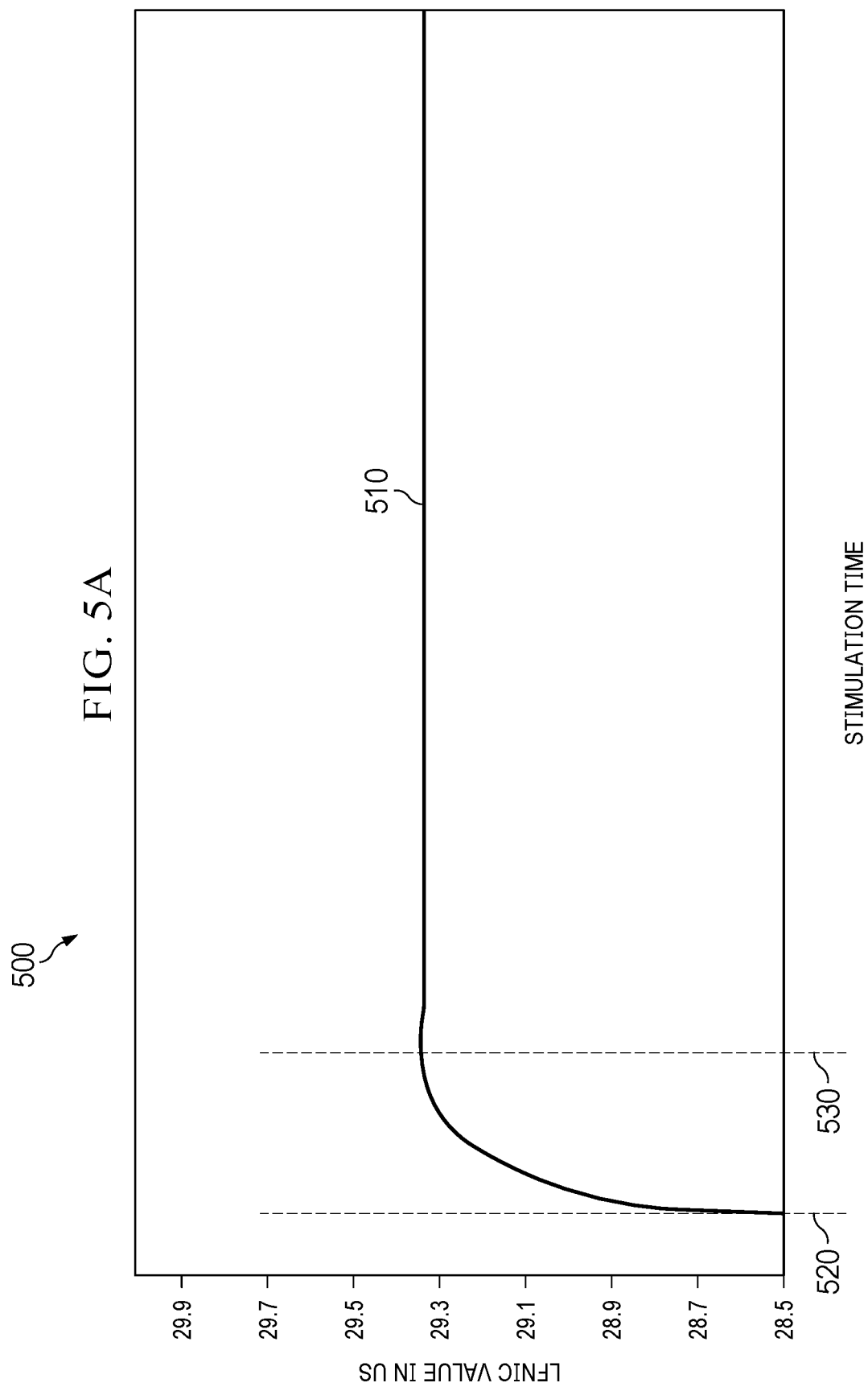

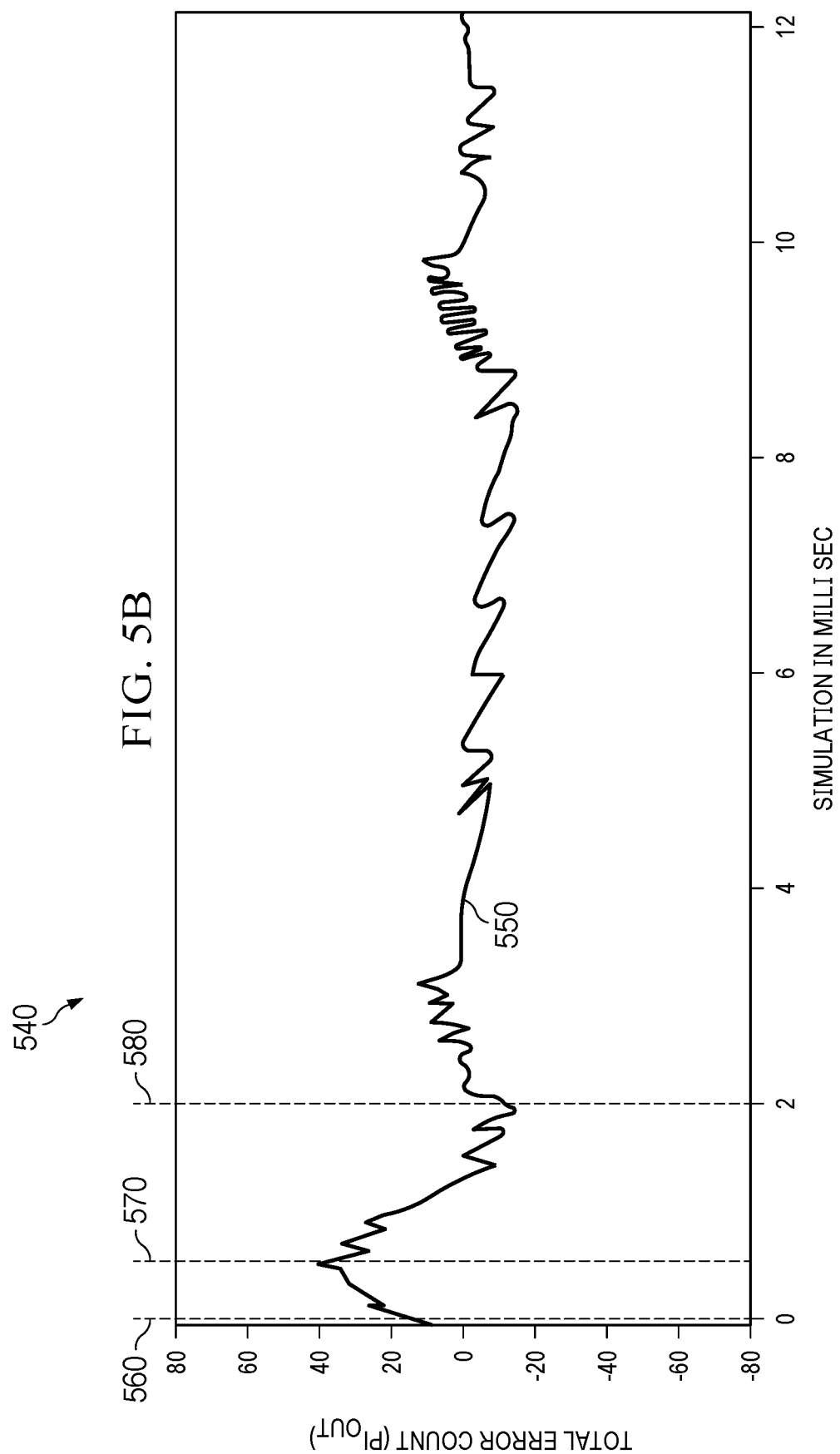

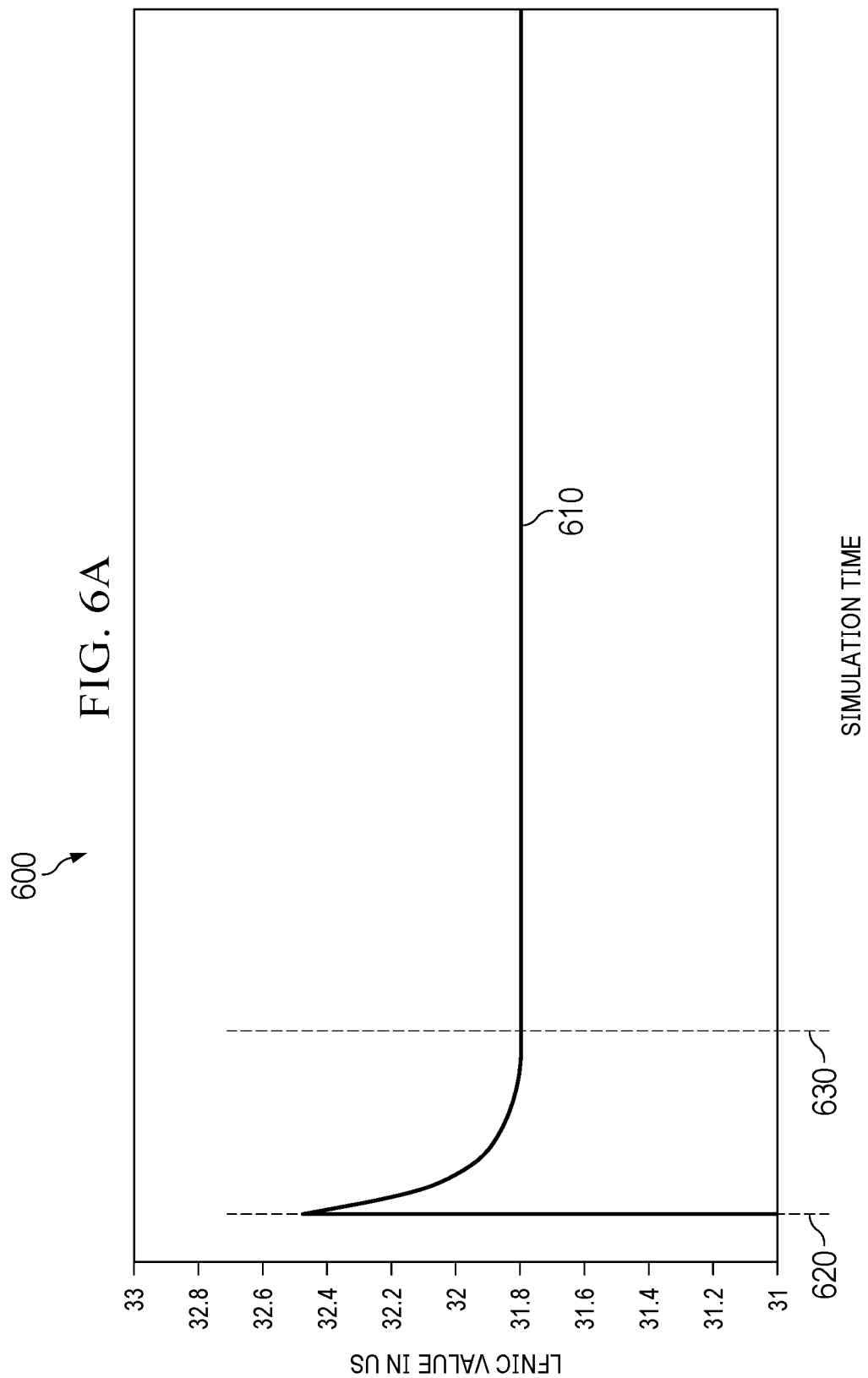

METHODS AND APPARATUS TO DYNAMICALLY CORRECT TIME KEEPING ERRORS

CROSS-REFERENCE TO RELATED APPLICATION

This patent application claims the benefit of and priority to India Provisional Patent Application Serial No. 202141058132 filed Dec. 14, 2021, which is hereby incorporated herein by reference in its entirety.

TECHNICAL FIELD

This description relates generally to buffering, and more particularly to methods and apparatus to dynamically correct time keeping errors.

BACKGROUND

As systems protocols, and wireless communications become increasingly complex, relatively higher resolution and more accurate timing circuitry are becoming more common. Systems, which rely on a consistent time base, may include an always-on power domain and a switchable power domain. The always-on power domain includes real-time clock (RTC) circuitry and clock generation circuitry that are continuously powered to ensure that the RTC circuitry generates an RTC count representative of real time. The switchable power domain includes a system timer that is powered when the system is powered. The system timer generates a system timer count representative of the real-time. The system timer count is supplied to different operations of the system by timer channels. The system timer count is reset when the system power domain is powered down and the always-on power domain remains powered. Typically, the RTC count is generated using an ultra-low leakage (ULL) clock, while the system timer count is generated using a system clock. The accuracy of the system timer count can be determined by comparing the RTC count to the system timer count.

SUMMARY

For methods and apparatus to dynamically correct time keeping errors, an example apparatus includes clock divider circuitry configured to divide a system clock by a pre-scaler input to generate a divided clock; counter circuitry configured to increment a system count based on the divided clock; comparison circuitry configured to determine a count difference between the system count and a real-time clock count; and controller circuitry configured to modify the pre-scaler input based on a comparison of the count difference to a threshold value.

BRIEF DESCRIPTION OF THE DRAWINGS

FIGS. 5A and 5B are timing diagrams of example dynamic error correction of the system timer of FIGS. 1 and 3 during an example operation where a frequency of the reference clock of FIG. 2 is reduced.

FIGS. 6A and 6B are timing diagrams of example dynamic error correction of the system timer of FIGS. 1 and 3 during an example operation where a frequency of the reference clock of FIG. 2 is increased.

The same reference numbers or other reference designators are used in the drawings to designate the same or similar (functionally and/or structurally) features.

DETAILED DESCRIPTION

Figure 1:
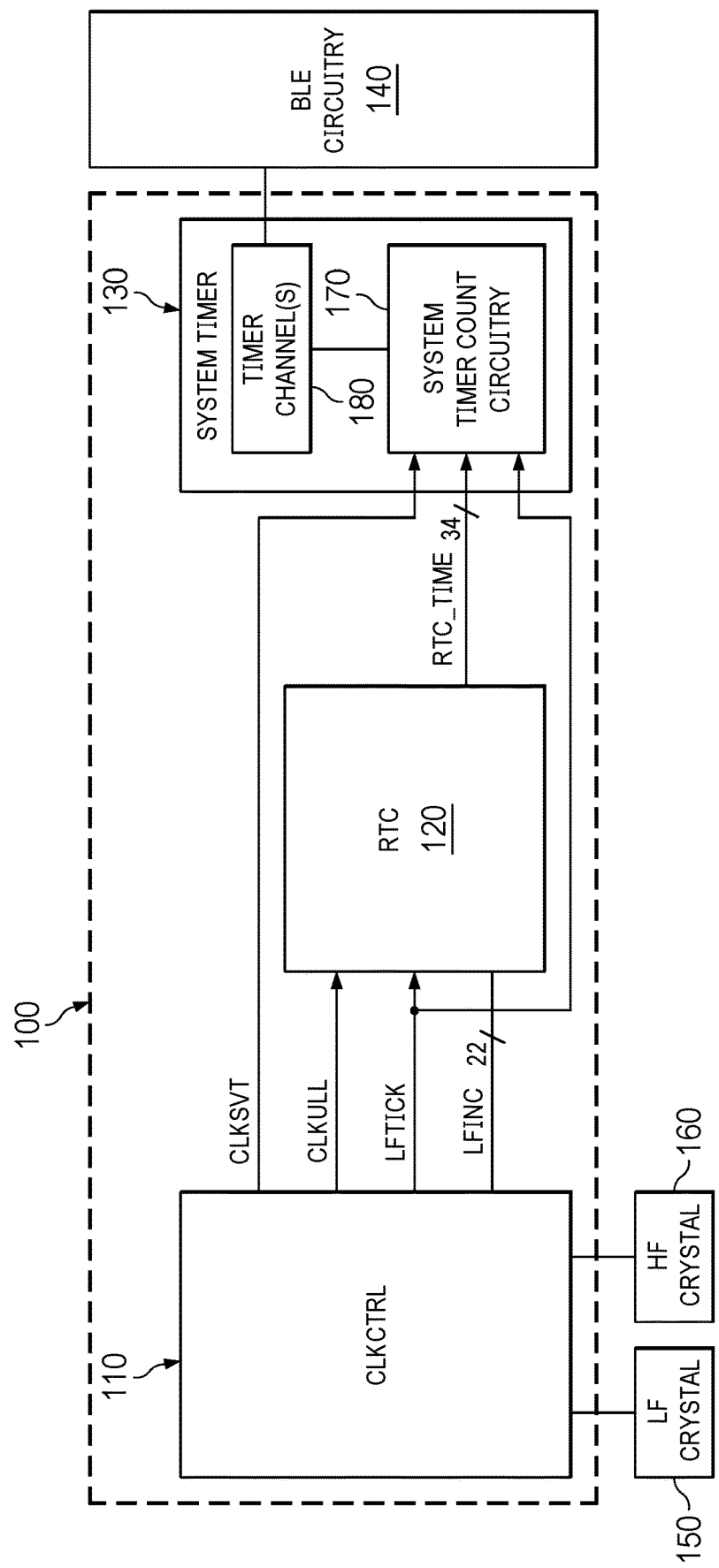
FIG. 1 is a block diagram of example timer circuitry including clock controller circuitry, real-time clock circuitry, and system timer, the timer circuitry configured to supply a system timer count to example Bluetooth circuitry.

The drawings are not necessarily to scale. Generally, the same reference numbers in the drawing(s) and this description refer to the same or like parts. Although the drawings show layers and regions with clean lines and boundaries, some or all of these lines and/or boundaries may be idealized. In reality, the boundaries and/or lines may be unobservable, blended and/or irregular.

As functions, protocols, and wireless communications become increasingly complex, relatively higher resolution and more accurate timing circuitry are becoming more common in systems. For example, Bluetooth communications utilize a consistent time base to determine when to open a reception window to receive data transmissions. Systems, which rely on a consistent time base, may include an always-on power domain that allows counter circuitry to continue to generate a real-time count of a clock and a switchable power domain that is powered when functions of the system are being implemented and unpowered when functions of the system are inactive. For example, an example microcontroller unit (MCU) includes a real-time clock (RTC) in an always-on power domain and a system timer in a switchable power domain.

The always-on power domain typically includes RTC circuitry and clock generation circuitry. The RTC circuitry increments an RTC count based on a synchronized reference clock and a reference count. The RTC circuitry increments the RTC count by the reference count based on the synchronized reference clock. The RTC circuitry provides the RTC count to the switchable power domain to set a system timer count equal to the RTC count and/or to enable the switchable power domain to determine timing errors in the system timer count.

The switchable domain includes a system timer that generates a system timer count based on the RTC count and a system clock. Following the switchable power domain being enabled or leaving reset, the system timer sets the system timer count equal to the RTC count to initialize the system timer count. The system timer counter increments the system timer count by counting the number of cycles of the system clock.

The system timer includes one or more timer channels configured to allow portions of the system to access the system timer count. The timer channels are configured for a capture and/or compare operation. In the capture configuration, the timer channels capture the system timer count in response to a trigger and set a register value equal to the system timer count. The capture configuration allows system operations to access the system timer count from a memory location when a capture event occurs. For example, a timer channel for a Bluetooth receiver is configured to capture the system timer count in response to receiving Bluetooth data. In such an example, the captured system timer count represents the time the Bluetooth data was received. The compare configuration allows a compare value to be set in the timer channel. The timer channel generates a compare event in response to the compare value being equal to the system timer count. For example, a timer channel in a Bluetooth receiver is configured to include a compare value representing a time to open a Bluetooth reception window. In such an example, the Bluetooth reception window is opened to receive Bluetooth data. The timer channels need the system timer count to be of a relatively high precision and accuracy to ensure system functions occur as designed.

In order to ensure an accurate system timer count, systems may compare the system timer count to the RTC count to determine timing errors, such as an incorrect system timer count. For example, variations in temperature and/or voltage may cause a frequency of the system clock to drift. Some systems correct for timing errors between the RTC and the system timer by setting the system timer count equal to the RTC count. For example, a system may be configured to set the system timer count equal to the RTC count in response to determining the system timer count is more than ten increments behind the RTC count. In such examples, the system timer count is discontinuous for the ten increments being corrected. Another method of correcting timing errors includes holding the system timer count from incrementing until the RTC count is equal to the system timer count. For example, the system timer prevents the system timer count from changing for ten increments in response to determining the system timer count is ten increments ahead of the RTC count. In such an example, the system timer count is captured at the same value until the RTC count is approximately equal to the system timer count, which may prevent critical timing errors in communication protocols. Systems which implement setting and/or holding the system timer count often fail to compensate compare values of the timing channels for such adjustments in the system timer count. Timer channels configured for capture operation may capture inaccurate system timer counts when setting and/or holding the system timer count, which causes inconsistencies in the captured system timer counts. Correcting such timing errors in the timer channels increases system complexity, cost, and often software complexity.

The examples described herein include timer circuitry including a system timer configured to dynamically correct differences between an RTC count and a system timer count by gradually correcting the system timer count by slowing or speeding up a divided clock. Example timer circuitry includes a clock controller circuitry, RTC circuitry, and a system timer. The clock controller circuitry generates a ULL clock, a reference clock, a synchronized reference clock, a reference count, and a system clock using a plurality of clock sources (e.g., resistor capacitor (RC) oscillators, external crystal oscillators, etc.). The clock controller circuitry generates the ULL clock based on the system clock. The clock controller circuitry generates the synchronized reference clock by synchronizing the reference clock to the ULL clock. The clock controller circuitry generates the reference count by counting cycles of a relatively high precision clock in a period of the synchronized reference clock. The relatively high precision clock has a frequency approximately equal to the system clock. The clock controller circuitry supplies the ULL clock, the synchronized reference clock, and the reference clock count to the RTC circuitry. The clock controller circuitry supplies the synchronized reference clock and the system clock to the system timer.

In the described examples, the RTC circuitry generates a RTC count by adding the reference count to the RTC count based on the synchronized reference clock. The RTC circuitry supplies the RTC count to the system timer. The system timer includes counter circuitry, clock divider circuitry, comparison circuitry, and controller circuitry. The counter circuitry increments a system timer count by one based on a divided system clock. The clock divider circuitry divides the system clock by a pre-scaler value to generate the divided system clock. The comparison circuitry determines an error value as a difference between the RTC count and the system timer count, such an error value is representative of timing errors. The controller circuitry determines a total error count based on the error value and previous error values. The controller circuitry modifies the pre-scaler value based on the error value. Advantageously, the system timer dynamically corrects timing errors by modifying the pre-scaler value to increase and/or decrease a frequency of the divided clock, which increases or decreases the incrementing of the system timer count. Advantageously, dynamically correcting the system count allows timer channels to continue operations without modifying compare and/or capture values.

FIG. 1 is a block diagram of timer circuitry 100 including an example clock controller circuitry 110, example RTC circuitry 120, and an example system timer 130, the timer circuitry 100 configured to supply a system timer count to example Bluetooth circuitry 140. The timer circuitry 100 is coupled to the Bluetooth circuitry 140, a first example crystal oscillator 150, and a second example crystal oscillator 160. The timer circuitry 100 supplies the Bluetooth circuitry 140 with a system timer count, generated by the system timer 130.

In the example of FIG. 1, the clock controller circuitry 110 is coupled to the RTC circuitry 120, the system timer 130, and the crystal oscillators 150 and 160. The clock controller circuitry 110 generates a system clock (CLKSVT), a ULL clock (CLKULL), a reference clock (LFCLK), a synchronized reference clock (LFTICK), and a reference clock count (LFINC) based on the crystal oscillators 150 and 160. The system clock is a clock signal of a frequency greater than the ULL clock and the reference clock. The clock controller circuitry 110 supplies the system clock to the system timer 130. The clock controller circuitry 110 generates the ULL clock by dividing the system clock. The reference clock is a clock signal of a frequency less than the ULL clock. The clock controller circuitry 110 generates the synchronized reference clock by synchronizing the reference clock to the ULL clock. The clock controller circuitry 110 generates the reference count by counting cycles of a relatively high precision clock (illustrated in connection with FIG. 2) in one cycle of the reference clock. The relatively high precision clock signal has a frequency approximately equal to the frequency the system clock. The clock controller circuitry 110 supplies the ULL clock, the synchronized reference clock, and the reference clock count to the RTC circuitry 120. The clock controller circuitry 110 supplies the system clock and the synchronized reference clock to the system timer 130. The clock circuitry 110 is in an always powered domain (not illustrated), such that the clock circuitry 110 continues to generate clock signals while a switchable power domain (not illustrated) is disabled. An example of the clock controller circuitry 110 is described in further detail in connection with FIG. 2.

The RTC circuitry 120 is coupled to the clock controller circuitry 110 and the system timer 130. The RTC circuitry 120 increments a RTC count (RTC_TIME) by the reference clock count based on the synchronized reference clock. For example, the RTC circuitry 120 increments the RTC count by fifteen hundred every thirty-one thousand two-hundred and fifty nano seconds (nS) when the frequency of the system clock is forty-eight megahertz (MHz), and the reference clock is thirty-two thousand kilohertz (kHz). The RTC circuitry 120 is in an always powered domain (not illustrated), such that the RTC circuitry 120 continues to increment while a switchable power domain (not illustrated) is disabled. The RTC circuitry 120 supplies the thirty-four least significant bits (LSBs) of the RTC count to the system timer 130.

The system timer 130 is coupled to the clock controller circuitry 110, the RTC circuitry 120, and the Bluetooth circuitry 140. The system timer 130 includes example system timer count circuitry 170 and example timer channel(s) 180. The system timer 130 sets the system timer count equal to the RTC count from the RTC circuitry 120 to initialize the system timer count. The system timer 130 increments the system timer count based on the system clock and the synchronized reference clock from the clock controller circuitry 110. The system timer 130 supplies the system timer count to the Bluetooth circuitry 140 by the timer channel(s) 180.

The system timer count circuitry 170 is coupled to the clock controller circuitry 110, the RTC circuitry 120, and the timer channel(s) 180. The system timer count circuitry 170 sets the system timer count equal to the RTC count following enabling power to the switchable power domain and/or a reset of the system timer 130. The system timer count circuitry 170 divides the system clock by a pre-scaler value to generate a divided clock. The system timer count circuitry 170 increments the system timer count by one for each cycle of the divided system clock. The system timer count circuitry 170 determines timing errors by comparing the system timer count to the RTC count. The system timer count circuitry 170 corrects timing errors by incrementing and/or decrementing the pre-scaler value to increase and/or decrease a rate at which the system timer count is incremented. For example, the system timer count circuitry 170 increments the system timer count by one every two-hundred and fifty nanoseconds (nS) when the pre-scaler value is twelve and the system clock is forty-eight megahertz (MHz). In such an example, the system timer count circuitry 170 increments the system timer count by one every two-hundred and seventy-one nanoseconds (nS) when the pre-scaler value incremented to thirteen. The system timer count circuitry supplies the system timer count to the timer channel(s) 180. An example of the system timer count circuitry 170 is described in further detail in connection with FIG. 3, below.

The timer channel(s) 180 are coupled to the system timer count circuitry 170 and the Bluetooth circuitry 140. The timer channel(s) 180 include circuitry to capture and/or compare the system timer count. The timer channel(s) 180 capture the system timer count by storing the system timer count in response to a capture event from the Bluetooth circuitry 140. For example, the timer channel(s) 180 capture the system timer count in response to the Bluetooth circuitry 140 generating a capture event corresponding to receiving a Bluetooth transmission. In such an example, the system timer count corresponds to a time that the Bluetooth transmission was received by the Bluetooth circuitry 140. The timer channel(s) 180 compare the system timer count to a compare value from the Bluetooth circuitry 140. The timer channel(s) generate an alert (e.g., event, interrupt, etc.) when the system timer count matches the compare value. For example, the Bluetooth circuitry 140 sets the compare value corresponding to set a time where the Bluetooth circuitry 140 is to open a reception window. In such an example, the Bluetooth circuitry 140 receives Bluetooth transmissions while the reception window is open. Advantageously, the system timer count circuitry 170 increases the accuracy of the timer channel(s) 180 by correcting timing errors gradually by modifying the pre-scaler value, such that capture values are accurate and compare values are not skipped.

Although in the example of FIG. 1, the timer circuitry 100 is discussed in connection with the Bluetooth circuitry 140, the timer circuitry 100 may be coupled to circuitry which needs access to the system timer count, such as processor circuitry, wired communication circuitry, wireless communication circuitry, etc.

Figure 2:
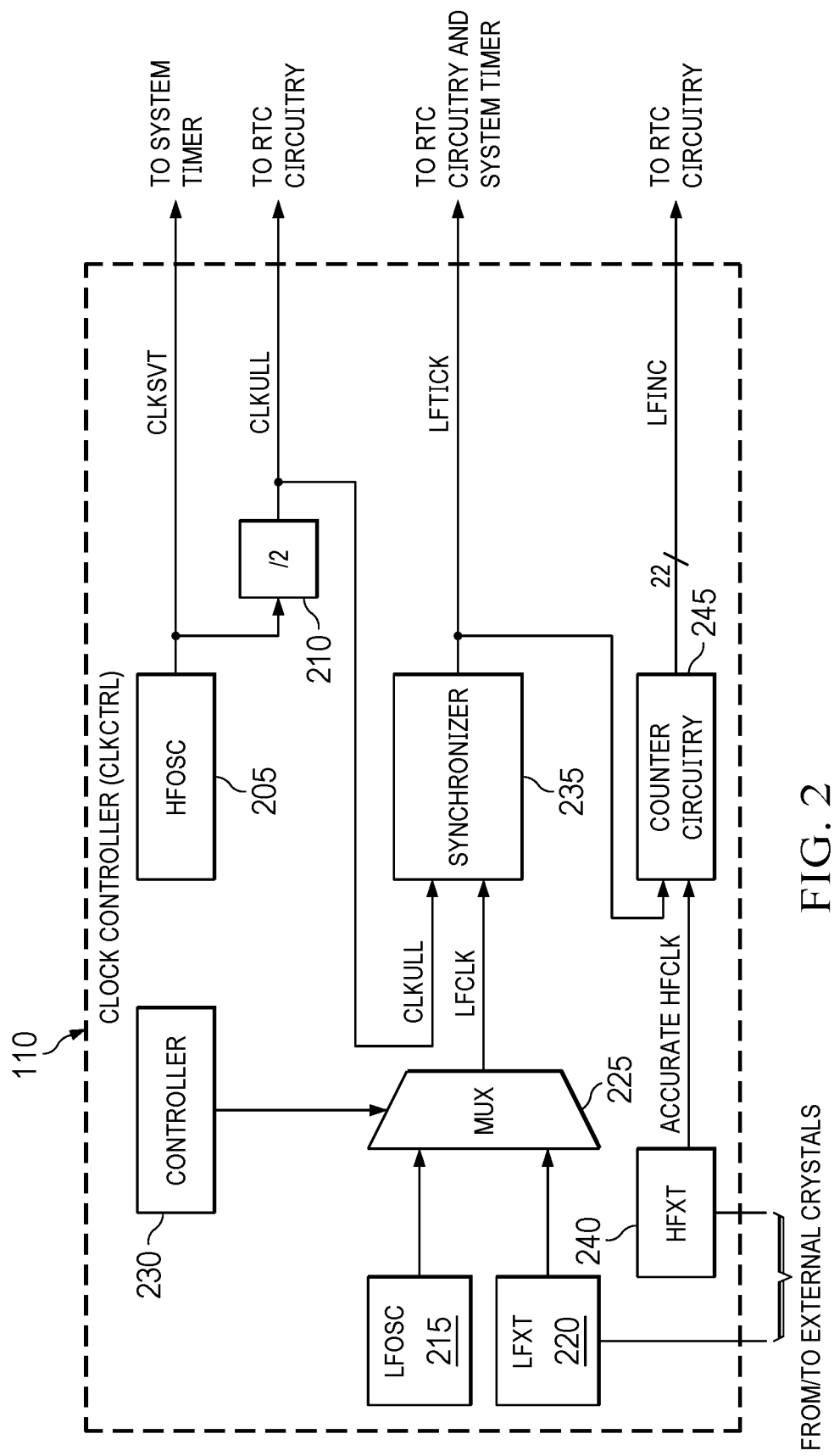
FIG. 2 is a block diagram of an example of the clock controller circuitry of FIG. 1 configured to generate a system clock, an ultra-low leakage clock, a reference clock, a synchronized reference clock, and a reference clock count.

FIG. 2 is a block diagram of an example of the clock controller circuitry 110 of FIG. 1 configured to generate a system clock (CLKSVT), an ultra-low leakage clock (CLKULL), a reference clock (LFCLK), a synchronized reference clock (LFTICK), and a reference clock count (LFINC). The clock controller circuitry 110 is configured to be coupled to the RTC circuitry 120 of FIG. 1, the system timer 130 of FIG. 1, and the crystal oscillators 150 and 160 of FIG. 1. In the example of FIG. 2, the clock controller circuitry 110 includes a first oscillator (HFOSC) 205, an example clock divider 210, a second oscillator (LFOSC) 215, a first example crystal oscillator circuitry (LFXT) 220, an example multiplexer (MUX) 225, an example controller 230, an example synchronizer 235, a second crystal oscillator circuitry (HFXT) 240, and an example counter circuitry 245.

The first oscillator 205 is configured to be coupled to the system timer 130 by a system clock output. The first oscillator 205 is coupled to the clock divider 210. The first oscillator 205 generates the system clock of a predetermined frequency. For example, the first oscillator 205 generates the system clock as a forty-eight megahertz (MHz) clock. The first oscillator 205 may include a resistor-capacitor (RC) oscillator. Alternatively, the clock controller circuitry 110 may be modified in accordance with the teachings disclosed herein such that the first oscillator 205 may be an internal (to the clock controller circuitry 110) RC oscillator, an external (to the clock controller circuitry 110) crystal oscillator, voltage-controlled oscillator, micro-electromechanical system oscillator, etc. The first oscillator 205 supplies the system clock to the system timer 130 and the clock divider 210.

The clock divider 210 is configured to be coupled to the RTC circuitry 120 by a clock output. The clock divider 210 is coupled to the first oscillator 205 and the synchronizer 235. The clock divider 210 generates the ULL clock by dividing the system clock from the first oscillator 205. In some examples, the clock divider 210 divides the frequency of the system clock from the first oscillator 205 by two. In one such example, the clock divider 210 generates the ULL clock as a twenty-four megahertz (MHz) clock when the system clock is a forty-eight megahertz (MHz) clock. Alternatively, the clock controller circuitry 110 may be modified in accordance with the teachings disclosed herein such that the clock divider 210 divides the frequency of the system clock by any value to generate the ULL clock or replaced with an oscillator of a frequency less than the frequency of the system clock. The clock divider 210 supplies the ULL clock to the RTC circuitry 120 and the synchronizer 235.

The second oscillator 215 is coupled to the multiplexer 225. The second oscillator 215 generates a first intermediate reference clock of a predetermined frequency. For example, the second oscillator 215 generates the first intermediate reference clock as a thirty-two kilohertz (kHz) clock. The second oscillator 215 is configured to generate the first intermediate reference clock of a frequency less than the frequency of the system clock and the ULL clock, such that the first intermediate reference clock is a relatively lower frequency clock. In some examples, the second oscillator 215 is a resistor-capacitor (RC) oscillator. Alternatively, the clock controller circuitry 110 may be modified in accordance with the teachings disclosed herein such that the second oscillator 215 may be an internal (to the clock controller circuitry 110) RC oscillator, an external (to the clock controller circuitry 110) crystal oscillator, voltage-controlled oscillator, micro-electromechanical system oscillator, etc. The second oscillator 215 supplies the first intermediate reference clock to the multiplexer 225.

The first crystal oscillator circuitry 220 is configured to be coupled to the first crystal oscillator 150. The first crystal oscillator circuitry 220 is coupled to the multiplexer 225. The first crystal oscillator circuitry 220 generates a second intermediate reference clock based on the first crystal oscillator 150. The first crystal oscillator circuitry 220 generates the second intermediate reference clock of a frequency determined by the first crystal oscillator 150. The first crystal oscillator circuitry 220 is configured to generate the second intermediate reference clock of a frequency less than the frequency of the system clock. For example, the first crystal oscillator circuitry 220 may generate the second intermediate reference clock as a thirty-two thousand seven hundred and sixty-eight hertz (Hz) clock, when the system clock is a forty-eight megahertz (MHz) clock. Alternatively, the clock controller circuitry 110 may be modified in accordance with the teachings disclosed herein such that the first crystal oscillator circuitry 220 may be an RC oscillator, voltage-controlled oscillator, micro-electromechanical system oscillator, etc. Advantageously, the first crystal oscillator circuitry 220 generates the second intermediate reference clock of a precision relatively higher than the second oscillator 215. The first crystal oscillator circuitry 220 supplies the second intermediate reference clock to the multiplexer 225.

The multiplexer 225 is coupled to the second oscillator 215, the first crystal oscillator circuitry 220, the controller 230, and the synchronizer 235. The multiplexer 225 supplies a reference clock by coupling one of the second oscillator 215 or the first crystal oscillator circuitry 220 to the synchronizer 235. The multiplexer 225 is controlled by the controller 230. The controller 230 configures the multiplexer 225 to couple the second oscillator 215 to the synchronizer 235 to supply a relatively lower power reference clock. The controller 230 configures the multiplexer 225 to couple the first crystal oscillator circuitry 220 to the synchronizer 235 to supply a relatively higher accuracy reference clock.

The synchronizer 235 is configured to be coupled to the RTC circuitry 120 and the system timer 130 by a clock output. The synchronizer 235 is coupled to the clock divider 210, the multiplexer 225, and the counter circuitry 245. The synchronizer 235 generates the synchronized reference clock by synchronizing the rising edges of the reference clock from the multiplexer 225 to rising edges of the ULL clock from the clock divider 210. The synchronizer 235 supplies the synchronized reference clock to the RTC circuitry 120, the system timer 130, and the counter circuitry 245.

The second crystal oscillator circuitry 240 is configured to be coupled to the second crystal oscillator 160. The second crystal oscillator circuitry 240 is coupled to the counter circuitry 245. The second crystal oscillator circuitry 240 generates a relatively high accuracy replica of the system clock based on the second crystal oscillator 160. The second crystal oscillator circuitry 240 generates the replica system clock of a frequency determined by the second crystal oscillator 160. The second crystal oscillator circuitry 240 is configured to generate the replica system clock of a frequency approximately (preferably exactly) equal to the frequency of the system clock. For example, the second crystal oscillator circuitry 240 generates the replica system clock as approximately a forty-eight megahertz (MHz) clock, when the system clock is a forty-eight megahertz (MHz) clock. Alternatively, the clock controller circuitry 110 may be modified in accordance with the teachings disclosed herein such that the second crystal oscillator circuitry 240 may be an RC oscillator, voltage-controlled oscillator, micro-electromechanical system oscillator, etc. Advantageously, the second crystal oscillator circuitry 240 generates the replica system clock as a precision clock of a relatively higher precision(?) than the first oscillator 205 generates the system clock. The second crystal oscillator circuitry 240 supplies the replica system clock to the counter circuitry 245.

The counter circuitry 245 is configured to be coupled to the RTC circuitry 120 by a counter output. The counter circuitry 245 is coupled to the synchronizer 235 and the second crystal oscillator circuitry 240. The counter circuitry 245 increments a reference clock count for every cycle of the replica system clock from the second crystal oscillator circuitry 240 in a cycle of the synchronized reference clock from the synchronizer 235. For example, the reference clock count is approximately one thousand and five hundred when the replica system clock is a forty-eight megahertz (MHz) clock, and the reference clock is a thirty-two kilohertz (kHz) clock. The counter circuitry 245 supplies the reference clock count to the RTC circuitry 120. Advantageously, the reference clock count represents the frequency of the system clock based on the reference clock.

Figure 3:
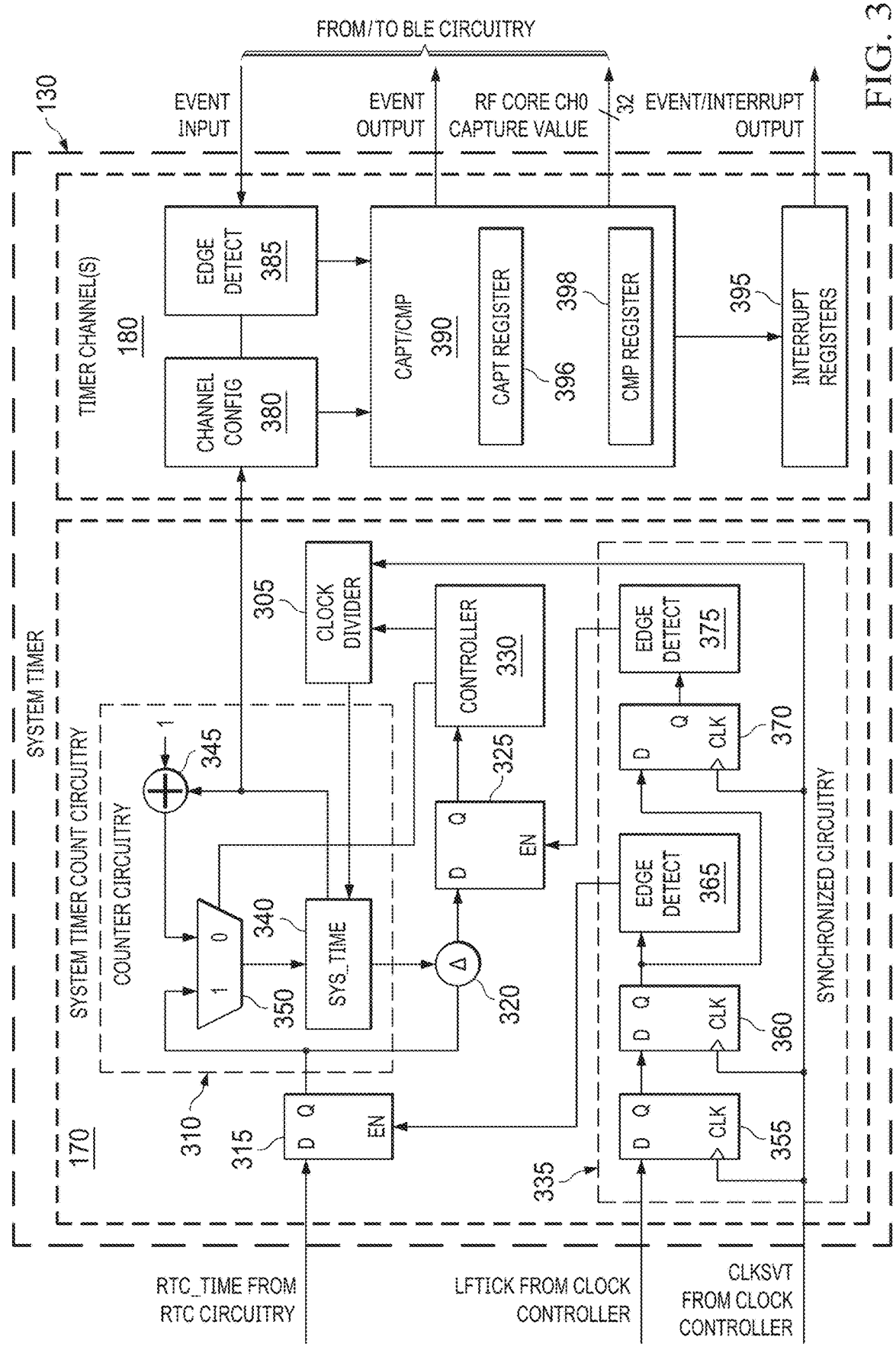
FIG. 3 is a block diagram of an example of the system timer of FIG. 1 configured to dynamically correct a system timer count based on the system clock of FIG. 2, the synchronized reference clock of FIG. 2, and a real-time clock count.

FIG. 3 is a block diagram of the system timer 130 of FIG. 1 configured to dynamically correct a system timer count (SYS_TIME) based on the system clock (CLKSVT) of FIG. 2, the synchronized reference clock (LFTICK) of FIG. 2, and a real-time clock count (RTC_TIME). The system timer 130 is configured to be coupled to the clock controller circuitry 110 of FIGS. 1 and 2, the RTC circuitry 120 of FIG. 1 by an RTC output, and the Bluetooth circuitry 140 of FIG. 1. In the example of FIG. 3, the system timer 130 includes the system timer count circuitry 170 of FIG. 1 and the timer channel(s) 180 of FIG. 1.

In the example of FIG. 3, the system timer count circuitry 170 includes example clock divider 305, example counter circuitry 310, a first example flip-flop 315, example comparison circuitry 320, a second example flip-flop 325, an example controller 330, and example synchronizer circuitry 335. The system timer count circuitry 170 generates a system timer count based on the system clock (CLKSVT)

from the clock controller circuitry 110 and the synchronized reference clock (LFTICK) from the clock controller circuitry 110. The system timer count circuitry 170 increments the system timer count based on the clock divider 305. The system timer count circuitry 170 detects timing errors by the comparison circuitry 320. The system timer count circuitry 170 corrects for timing errors by modifying the clock divider 305. The system timer count circuitry 170 supplies the system timer count to the timer channel(s) 180.

The clock divider 305 is configured to be coupled to the system clock from the clock controller circuitry 110 by a clock input. The clock divider 305 is coupled to the counter circuitry 310 by a divider output and the controller 330 by a divider input. The clock divider 305 generates a divided clock by dividing the system clock by a pre-scaler value from the controller 330. For example, the clock divider 305 generates a four megahertz (MHz) clock when the system clock is a forty-eight megahertz (MHz) clock, and the pre-scaler value is set to twelve. The clock divider 305 supplies the divided clock to the counter circuitry 310.

The counter circuitry 310 is coupled to the timer channel(s) 180 by a first counter output, the clock divider 305 by a divider output, the first flip-flop 315 by a first counter input, the comparison circuitry 320 by a second counter output, and the controller 330 by a second counter input. In the example of FIG. 3, the counter circuitry 310 includes an example register 340, an example adder 345, and an example multiplexer 350. The counter circuitry 310 stores the system timer count in the register 340. The counter circuitry 310 initializes the system timer count by coupling the register 340 to the RTC count. The counter circuitry 310 increments the system timer count by the adder 345 and the divided clock from the clock divider 305.

The register 340 is coupled to the timer channel(s) 180, the clock divider 305, the comparison circuitry 320, the adder 345, and the multiplexer 350. The register 340 stores the system timer count. The register 340 is set by the multiplexer 350. The register 340 updates the system timer count based on the divided clock from the clock divider 305. The register 340 supplies the system timer count to the timer channel(s) 180, the comparison circuitry 320, and the adder 345.

The adder 345 is coupled to the register 340 and the multiplexer 350. The adder 345 generates an incremented system timer count by adding one to the system timer count from the register 340. Alternatively, an increment input of the adder 345 may be coupled to the controller 330 to add any value to the system timer count to increment the system timer count. The adder 345 supplies the incremented system timer count to the multiplexer 350.

The multiplexer 350 is coupled to the first flip-flop 315 by a first multiplexer input, the controller 330 by a control input, the register 340 by a multiplexer output, and the adder 345 by a second multiplexer input. The multiplexer 350 sets the system timer count by coupling the RTC count from the first flip-flop 315 or the incremented system timer from the adder 345 to the register 340. The multiplexer 350 is controlled by the controller 330. The multiplexer 350 couples the first flip-flop 315 to the register 340 to initialize and/or set the system timer count equal to the RTC count. For example, the controller 330 configures the multiplexer 350 to set the system timer count equal to the RTC count following a reset of the system timer 130 and/or following a determination that the system timer 130 was recently enabled. The multiplexer 350 couples the incremented system timer count from the adder 345 to the register 340 to set the system timer counter equal to the incremented system timer count.

The first flip-flop 315 includes a data input (D) coupled to the RTC count from the RTC circuitry 120 by the RTC output. The first flip-flop 315 includes a data output (Q) coupled to the counter circuitry 310 and the comparison circuitry 320. The first flip-flop 315 includes an enable input (EN) coupled to the synchronizer circuitry 335. The first flip-flop 315 latches the RTC count from the RTC circuitry 120 based on the enable from the synchronizer circuitry 335. The first flip-flop 315 sets the data output equal to the data input when enabled by the synchronizer circuitry 335. The first flip-flop 315 holds the data output equal to the RTC count that was latched from the data input until a next time where the synchronizer circuitry 335 enables the first flip-flop 315. The first flip-flop 315 is a delay (D) flip-flop. Alternatively, the system timer count circuitry 170 may be modified in accordance with the teachings disclosed herein such that the first flip-flop 315 may be a set reset (SR) flip-flop, a toggle (T) flip-flop, a JK flip-flop, etc. The first flip-flop 315 supplies the latched RTC count to the counter circuitry 310 and the comparison circuitry 320.

The comparison circuitry 320 is coupled to the counter circuitry 310 by a first comparison input, the first flip-flop 315 by a second comparison input, and the second flip-flop 325 by a comparison output. The comparison circuitry 320 determines a count difference between the system timer count from the counter circuitry 310 and the latched RTC count from the first flip-flop 315. The count difference is representative of timing errors between the RTC count and the system timer count. The comparison circuitry 320 supplies the count difference to the second flip-flop 325.

The second flip-flop 325 includes a data input (D) coupled to the count difference from the comparison circuitry 320. The second flip-flop 325 includes a data output (Q) coupled to controller 330. The second flip-flop 325 includes an enable input (EN) coupled to the synchronizer circuitry 335. The second flip-flop 325 latches the count difference from the comparison circuitry 320 based on the enable from the synchronizer circuitry 335. The second flip-flop 325 sets the data output equal to the data input when enabled by the synchronizer circuitry 335. The second flip-flop 325 holds the data output equal to the count difference that was latched from the data input until a next time where the synchronizer circuitry 335 enables the second flip-flop 325. The second flip-flop 325 is a D flip-flop. Alternatively, the system timer count circuitry 170 may be modified in accordance with the teachings disclosed herein such that the second flip-flop 325 may be a SR flip-flop, a T flip-flop, a JK flip-flop, etc. The second flip-flop 325 supplies the latched count difference to the controller 330.

The controller 330 is coupled to the clock divider 305 by the divider input, the counter circuitry 310 by the second counter input, and the second flip-flop 325 by an error input. The controller 330 initializes the pre-scaler value to a default value and configures the counter circuitry 310 to set the system timer count equal to the latched RTC count in response to determining a reset event or the system timer 130 transitioning from not being powered to being powered. The controller 330 modifies the pre-scaler value based on the latched count difference to dynamically correct the system timer count for timing errors.

The controller 330 increments the pre-scaler value to decrease the frequency of the divided clock signal. For example, incrementing the pre-scaler value from twelve to thirteen decreases the divided clock from four megahertz (MHz) to approximately three and seven-tenths megahertz (MHz). In such an example, the system timer count is incremented based the reduced divided clock to allow the RTC count to catch up to the system timer count without creating discontinuous time. The controller 330 is configured to decrement the pre-scaler value to increase the frequency of the divided clock signal. For example, decrementing the pre-scaler value from twelve to eleven increases the divided clock from four megahertz (MHz) to approximately four and four tenths megahertz (MHz). In such an example, the system timer count is incremented based the increased divided clock to allow the system timer count to catch up to the RTC count without creating discontinuous time.

The controller 330 determines a total error count ($PI_{OUT}$) based on the latched count difference (error), an accumulated error ($Acc_{error}$), a proportional gain ($K_P$), and an integral gain ($K_I$). The latched count difference is the difference between the latched RTC count from the first flip-flop 315 and the system timer count from the counter circuitry 310 provided by comparison circuitry 320. The latched count difference is supplied by the second flip-flop 325 coupled to the comparison circuitry 320 when enabled by the synchronizer circuitry 335. The accumulated error is a sum of the latched count differences since the system timer count circuitry 170 was enabled. For example, following a reset or enabling of the system timer count circuitry 170 the accumulated error is zero in response to the system timer count being set equal to the latched RTC count, however at a second time, when the latched count difference is ten, the accumulated error at the second time becomes ten. In such an example, at a third time, when the latched count difference is negative five, the accumulated error becomes the accumulated error at the second time plus the latched count difference, such that the accumulated error is five at the third time. The proportional gain is a gain value representative of a proportional component of the error calculation of Equation (1), below. The proportional gain determines a contribution of the latch count difference to the total error count in comparison to the integral gain. For example, the proportional gain may be increased to increase an impact of the latched count difference on the total error count and allow the latched count difference to rapidly change the total error count. The proportional gain is a value stored in the controller 330. The proportional gain may be configured during manufacturing, set in response to operations of the system timer 130, set by the timer channel(s) 180, etc. The integral gain is a gain value representative of an integral component of the error calculation of Equation (1), below. The integral gain determines a contribution of the accumulated error to the total error count in comparison to the proportional gain. For example, the integral gain may be increased to increase an impact of the accumulated error on the total error count and prevent the latched error difference from rapidly changing the total error count. The integral gain is a value stored in the controller 330. The integral gain may be configured during manufacturing, set in response to operations of the system timer 130, set by the timer channel(s) 180, etc. Settling time of the total error count is based on the proportional gain and integral gain. The settling time of the total error count may be increased by decreasing the proportional gain. The settling time of the total error count may be decreased by increasing the proportional gain.

The controller 330 determines the total error count by adding a multiplication of the integral gain and the accumulated error to a multiplication of the proportional gain and latched count difference. The controller 330 determines the total error count using Equation (1), below.

$$PI_{OUT}=K_I*Acc_{error}+K_P*error, \quad \text{Equation (1)}$$

The controller 330 determines whether to modify the pre-scaler value by comparing the total error count to a first threshold value and a second threshold value. The threshold values represent total error counts which require dynamic correction. The first threshold value represents a positive threshold. The controller 330 decrements the pre-scaler value in response to determining the total error count is greater than or equal to the first threshold. For example, the controller 330 increments the pre-scaler value from twelve to thirteen when the first threshold value is eight and the total error count is greater than or equal to eight. The second threshold value represents a negative threshold. The controller 330 decrements the pre-scaler value in response to determining the total error count is less than or equal to the second threshold. For example, the controller 330 decrements the pre-scaler value from twelve to eleven when the second threshold value is negative eight and the total error count is less than or equal to negative eight.

The controller 330 is configured to set the pre-scaler value to a default pre-scaler value prior to determining whether to modify the pre-scaler value. For example, at a first time the controller 330 decrements a default pre-scaler value from twelve to supply the clock divider 305 with a pre-scaler value of eleven, however at a second time, following the first time, the controller 330 may determine to increment the default pre-scaler value from twelve to supply the clock divider 305 with a pre-scaler value of thirteen. The controller 330 supplies the clock divider 305 with a pre-scaler value within plus/minus one of the default pre-scaler value.

The controller 330 supplies the clock divider 305 with a pre-scaler value within plus/minus one of the default pre-scaler value for approximately one cycle of the divided clock from the clock divider 305. For example, the counter circuitry 310 increments the system timer count by one-hundred and twenty-five when the system timer is forty-eight megahertz (MHz), the default pre-scaler value is twelve, and the synchronized reference clock is thirty-two kilohertz (kHz), however when counter circuitry 310 increments the system timer count by one-hundred and twenty-six when the controller 330 decrements the default pre-scaler value to eleven. In such an example, a first cycle of the divided clock is approximately two-hundred and thirty nanoseconds (nS), corresponding to a pre-scaler value of eleven, while a second cycle of the divided clock is approximately two-hundred and fifty nanoseconds (nS), corresponding to a pre-scaler value of twelve. Advantageously, adjusting the pre-scaler value for a first cycle of the divided clock from the clock divider 305 increases the precision of such modifications to the pre-scaler value allow the controller 330 to dynamically correct the system timer count to be approximately equal to the RTC count. Advantageously, modifying the default pre-scaler value within plus/minus one allows the system timer count to gradually correct timing errors.

The synchronizer circuitry 335 is coupled to the clock controller circuitry 110 by a reference input and the flip-flops 315 and 325 by enable outputs. In the example of FIG. 3, the synchronizer circuitry 335 includes a third example flip-flop 355, a fourth example flip-flop 360, first edge detection circuitry 365, a fifth example flip-flop 370, and second edge detection circuitry 375. The synchronizer circuitry 335 enables the flip-flops 315 and 325 based on the synchronized reference clock from the clock controller circuitry 110 to the system clock from the clock controller circuitry 110. The synchronizer circuitry 335 enables the flip-flops 315 and 325 synchronizes rising edges of the synchronized reference clock to rising edges of the system clock to ensure that the comparison circuitry 320 compares the system timer count from the counter circuitry 310 to the RTC count from the RTC circuitry 120 corresponding to approximately (preferably exactly) the same time.

The third flip-flop 355 includes a data input (D) configured to be coupled to the synchronized reference clock from the clock controller circuitry 110. The third flip-flop 355 includes a clock input (CLK) configured to be coupled to the system clock from the clock controller circuitry 110. The third flip-flop 355 includes a data output (Q) coupled to the fourth flip-flop 360. The third flip-flop 355 is configured to latch the synchronized reference clock at a rising edge of the system clock. The third flip-flop 355 sets the data output to the latched synchronized reference clock until the next edge of the system clock. The third flip-flop 355 is a D flip-flop. Alternatively, the system timer count circuitry 170 may be modified in accordance with the teachings disclosed herein such that the third flip-flop 355 may be a SR flip-flop, a T flip-flop, a JK flip-flop, etc. The third flip-flop 355 supplies the latched synchronized reference clock to the fourth flip-flop 360.

The fourth flip-flop 360 includes a data input (D) coupled to the third flip-flop 355. The fourth flip-flop 360 includes a clock input (CLK) configured to be coupled to the system clock from the clock controller circuitry 110. The fourth flip-flop 360 includes a data output (Q) coupled to the first edge detection circuitry 365 and the fifth flip-flop 370. The fourth flip-flop 360 is configured to latch the latched synchronized reference clock at a rising edge of the system clock. The fourth flip-flop 360 sets the data output to the latched clock until the next edge of the system clock. The fourth flip-flop 360 is a D flip-flop. Alternatively, the system timer count circuitry 170 may be modified in accordance with the teachings disclosed herein such that the fourth flip-flop 360 may be a SR flip-flop, a T flip-flop, a JK flip-flop, etc. The fourth flip-flop 360 supplies the latched clock to the first edge detection circuitry 365 and the fifth flip-flop 370.

In the example of FIG. 3, the flip-flops 355 and 360 may be referred to as a two-stage synchronizer, such that the flip-flops 355 and 360 may be illustrated and/or replaced by one or more stage synchronizer circuitry. The flip-flops 355 and 360 synchronize the synchronized reference clock to rising edges of the system clock. Alternatively, the flip-flops 355 and 360 may be configured to synchronize the synchronized reference clock to falling edges of the system clock and/or to an alternative clock.

The first edge detection circuitry 365 is coupled to the enable input of the first flip-flop 315 and the fourth flip-flop 360. The first edge detection circuitry 365 enables and/or disables the first flip-flop 315 based on the latched clock from the fourth flip-flop 360. The first edge detection circuitry 365 may be configured to detect rising and/or falling edges of the latched clock. For example, the first edge detection circuitry 365 detects a rising edge by determining the data output of the fourth flip-flop 360 transitions from a logic zero to a logic one. The first edge detection circuitry 365 enables the first flip-flop 315 in response to detecting a rising edge of the latched clock, when configured to detect rising edges. For example, the first edge detection circuitry 365 enables the first flip-flop 315 to latch the RTC count at a time corresponding to a rising edge of the latched clock, such as the data output of the fourth flip-flop 360 transitions from a logic zero to a logic one. In such an example, the first flip-flop 315 latches the RTC count at a rising edge of the system clock following the first edge detection circuitry 365 enabling the first flip-flop 315. The first edge detection circuitry 365 disables the first flip-flop 315 in response to determining the data output of the fourth flip-flop 360 remains the same and/or corresponds to an edge not being detected, such as a falling edge when configured to detect rising edges. For example, the first edge detection circuitry 365 disables the first flip-flop 315 in response to the data output of the fourth flip-flop 360 remaining constant for a duration of time. In such an example, the duration of time may be greater than or equal to one cycle of the system clock.

The fifth flip-flop 370 includes a data input (D) coupled to the fourth flip-flop 360. The fifth flip-flop 370 includes a clock input (CLK) configured to be coupled to the system clock from the clock controller circuitry 110. The fifth flip-flop 370 includes a data output (Q) coupled to the second edge detection circuitry 375. The fifth flip-flop 370 is configured to latch the latched clock from the fourth flip-flop 360 at a rising edge of the system clock. The fifth flip-flop 370 sets the data output to the synchronized latched clock until the next edge of the system clock. The fifth flip-flop 370 is a D flip-flop. Alternatively, the system timer count circuitry 170 may be modified in accordance with the teachings disclosed herein such that the fifth flip-flop 370 may be a SR flip-flop, a T flip-flop, a JK flip-flop, etc. The fifth flip-flop 370 supplies the synchronized latched clock to the second edge detection circuitry 375.

In the example of FIG. 3, the flip-flops 355, 360, and 370 may be referred to as a three-stage synchronizer, such that the flip-flops 355, 360, and 370 may be illustrated and/or replaced by one or more stage synchronizer circuitry. The flip-flops 355, 360, and 370 synchronize the synchronized reference clock to rising edges of the system clock. Alternatively, the flip-flops 355, 360, and 370 may be configured to synchronize the synchronized reference clock to falling edges of the system clock and/or to an alternative clock.

The second edge detection circuitry 375 is coupled to the enable input of the second flip-flop 325 and the data output of the fifth flip-flop 370. The second edge detection circuitry 375 enables and/or disables the second flip-flop 325 based on the synchronized latched clock from the fifth flip-flop 370. The second edge detection circuitry 375 may be configured to detect rising and/or falling edges of the synchronized latched clock. For example, the second edge detection circuitry 375 detects a rising edge by determining the data output of the fifth flip-flop 370 transitions from a logic zero to a logic one. The second edge detection circuitry 375 enables the second flip-flop 325 in response to detecting a rising edge of the synchronized latched clock, when configured to detect rising edges. For example, the second edge detection circuitry 375 enables the second flip-flop 325 to latch the count difference from the comparison circuitry 320 at a time corresponding to a rising edge of the synchronized latched clock, such as the data output of the fifth flip-flop 370 transitions from a logic zero to a logic one. In such an example, the second flip-flop 325 latches the count difference at a rising edge of the system clock following the second edge detection circuitry 375 enabling the second flip-flop 325. The second edge detection circuitry 375 disables the second flip-flop 325 in response to determining the data output of the fifth flip-flop 370 remains the same and/or corresponds to an edge not being detected, such as a falling edge when configured to detect rising edges. For example, the second edge detection circuitry 375 disables the first flip-flop 315 in response to the data output of the fifth flip-flop 370 remaining constant for a duration of time. In such an example, the duration of time may be greater than or equal to one cycle of the system clock.

The timer channel(s) 180 are coupled to the counter circuitry 310. In the example of FIG. 3, the timer channel(s) 180 includes example channel configuration circuitry 380, third example edge detection circuitry 385, capture and compare circuitry 390, and example interrupt register(s) 395. The timer channel(s) 180 illustrate circuitry of a single timer channel. Alternatively, the timer channel(s) 180 may include a plurality of the circuitry 380-395 to support a plurality of timer operations. The timer channel(s) 180 may be configured for capture and/or compare operations. An example capture operation includes capturing the system timer count in a capture register 396 of the capture and compare circuitry 390 in response to an event input from the third edge detection circuitry 385. An example compare operation includes generates an interrupt when the system timer count is equal to a compare value stored and configured in a compare register 398 of the capture and compare circuitry 390.

The channel configuration circuitry 380 is coupled to the system timer count circuitry 170, the third edge detection circuitry 385, and the capture and compare circuitry 390. The channel configuration circuitry 380 includes circuitry corresponding to capture and/or compare operations. In a capture configuration, the channel configuration circuitry may supply the system timer count to the capture and compare circuitry 390 in response to third edge detection circuitry 385 detecting a rising edge and/or a falling edge in a trigger signal received via an event input. In a compare configuration, the channel configuration circuitry 380 supplies the system timer count to the capture and compare circuitry 385 independent of the third edge detection circuitry 385. The channel configuration circuitry 380 may be configured by design, by the capture and compare circuitry 390, and/or the Bluetooth circuitry 140.

The third edge detection circuitry 385 is coupled to the Bluetooth circuitry 140, the channel configuration circuitry 380 and the capture and compare circuitry 390. The third edge detection circuitry 385 determines a rising edge and/or falling edge of a trigger signal provided on the event input from the Bluetooth circuitry 140. For example, the Bluetooth circuitry 140 sets the event input to a logic one in response to receiving a transmission, such an event may correspond to a capture operation. The third edge detection circuitry 385 supplies a detection value to the channel configuration circuitry 380 and/or the capture and compare circuitry 390.

The capture and compare circuitry 390 is coupled to the channel configuration circuitry 380, the third edge detection circuitry 385, and the interrupt register(s) 395. The capture and compare circuitry 390 is configured for capture and/or compare operations. In the capture configuration, the capture and compare circuitry 390 supplies the system timer count from the channel configuration circuitry 380 to the capture register 396 and/or the Bluetooth circuitry 140 when the third edge detection circuitry 385 detects a rising edge and/or a falling edge. The capture and compare circuitry 390 indicates the capture of the system timer count by setting the interrupt register(s) 395 corresponding to a capture event. In the compare configuration, the capture and compare circuitry 390 generates an interrupt when the system timer count from the channel configuration circuitry 380 is equal to the compare value stored in the compare register 398. In such a configuration, the compare value may be set by the channel configuration circuitry 380, the Bluetooth circuitry 140, by design, and/or by a system coupled to the timer channel(s) 180. The capture and compare circuitry 390 indicates the compare value is equal to the system timer count by setting the interrupt register(s) 395 corresponding to a compare event.

The interrupt register(s) 395 is coupled to the capture and compare circuitry 390. The interrupt register(s) 395 include a plurality of registers (not illustrated) configured to indicate an interrupt. For example, the capture and compare circuitry 390 sets the interrupt register(s) 395 in response to a capture event and/or a compare event. External circuitry (such as processor circuitry) clears the value of the interrupt register(s) to indicate a completion of an interrupt service routine.

Figure 4:
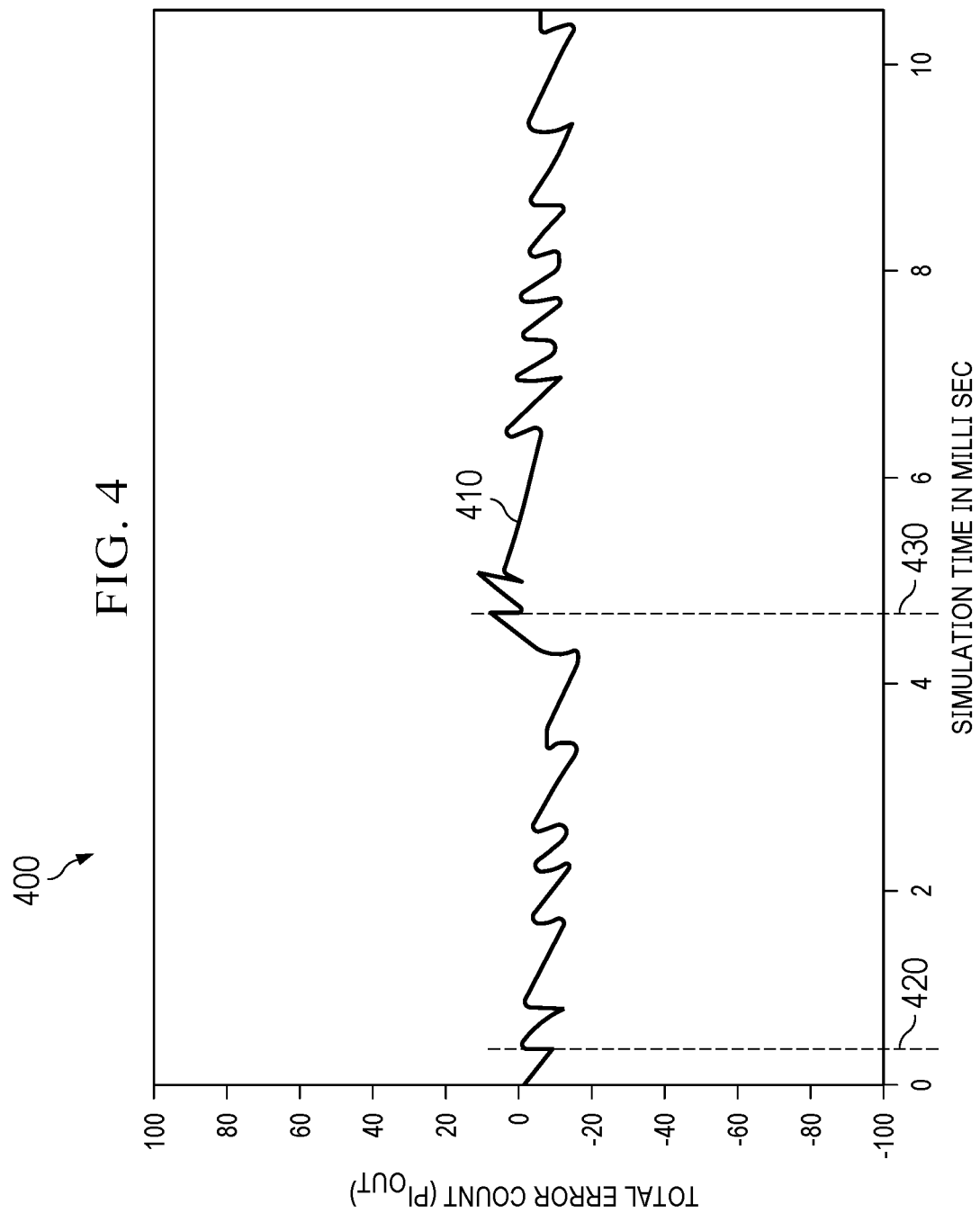
FIG. 4 is a timing diagram of example dynamic error correction of the system timer of FIGS. 1 and 3.

FIG. 4 is a timing diagram 400 of dynamic error correction of the system timer 130 of FIGS. 1 and 3. In the example of FIG. 4, the timing diagram 400 illustrates the total error count ($PI_{OUT}$) 410 determined by the controller 330 of FIG. 3 across an example operation where the reference clock and the system clock remain at fixed frequencies. The total error count 410 is determined using Equation (1), above. The total error count 410 is determined based on the synchronized clock from the synchronizer circuitry 335 of FIG. 3 of a frequency approximately equal to the synchronized reference clock from the clock controller circuitry 110 of FIGS. 1 and 2. The synchronized clock is generated by synchronizing edges of the synchronized reference clock to edges of the system clock from the clock controller circuitry 110.

The total error count 410 represents the system timer count incrementing slower than the RTC count is incrementing as negative values. The total error count 410 represents the system timer count incrementing faster than the RTC count is incrementing as a positive value. The controller 330 determines whether to modify the pre-scaler value based on a first threshold value and a second threshold value stored in the controller 330. The controller 330 modifies the pre-scaler value when the error output is greater than the first threshold value or is less than the second threshold value. The controller 330 modifies the pre-scaler value to increase or decrease the incrementing of the system timer count to approach the RTC count. Incrementing the pre-scaler value reduces the rate at which the system timer count is being incremented by the counter circuitry 310 by reducing the frequency of the divided clock from the clock divider 305. For example, the controller 330 increments the pre-scaler value when the total error count 410 is greater than or equal to the first threshold value. Decrementing the pre-scaler value increases the rate at which the system timer count is being incremented by the counter circuitry 310 by increasing the frequency of the divided clock from the clock divider 305. For example, the controller 330 decrements the pre-scaler value when the total error count 410 is less than or equal to the second threshold value.

At a first time 420, the controller 330 determines the total error count 410 is less than or equal to the second threshold value indicating the system timer count is incrementing slower than the RTC count. At the first time 420, the controller 330 decreases the pre-scaler value to increase the frequency of the divided clock from the clock divider 305, which increases the rate of incrementing the system timer count. For example, decreasing the pre-scaler value from twelve to eleven, when the system clock is a forty-eight megahertz (MHz) clock, subtracts twenty and eight tenths nanoseconds (nS) from the time between increments. Immediately following the first time 420, the total error count 410 increases in response to the decremented pre-scaler value being set for one cycle of the divided clock following which the pre-scaler value returns to the default pre-scaler value.

For example, when the system clock is a forty-eight megahertz (MHz) clock, the reference clock is thirty-two kilohertz (kHz), and the pre-scaler value is twelve, the system clock count is incremented by approximately one-hundred and twenty-five for every cycle of the synchronized reference clock, while the system clock count is incremented by approximately one-hundred and twenty-six for every cycle of the synchronized reference clock when the pre-scaler value is set to eleven for a first cycle of the divided clock from the clock divider 305 in a cycle of the synchronized reference clock.

At a second time 430, the controller 330 determines the total error count 410 is greater than or equal to the first threshold value indicating the system timer count is incrementing faster than the RTC count. At the second time 430, the controller 330 increases the pre-scaler value to decrease the frequency of the divided clock from the clock divider 305, which decreases the rate of incrementing the system timer count. For example, increasing the pre-scaler value from twelve to thirteen, when the system clock is a forty-eight megahertz (MHz) clock, adds twenty and eight tenths nanoseconds (nS) from the time between increments. Immediately following the second time 430, the total error count 410 decreases in response to the incremented pre-scaler value being set for one cycle of the divided clock following which the pre-scaler value returns to the default pre-scaler value. For example, when the system clock is a forty-eight megahertz (MHz) clock, the reference clock is thirty-two megahertz (MHz), and the pre-scaler value is twelve, the system clock count is incremented by approximately one-hundred and twenty-five for every cycle of the reference clock, while the system clock count is incremented by approximately one-hundred and twenty-four for every cycle of the synchronized reference clock when the pre-scaler value is set to thirteen for a first cycle of the divided clock from the clock divider 305 in a cycle of the synchronized reference clock.

Advantageously, the system timer count circuitry 170 dynamically corrects the system clock count by increasing and/or decreasing the pre-scaler value. Advantageously, the system timer count is a continuous signal. Advantageously, the threshold values may be modified to increase or decrease accuracy of the system timer count in comparison to the RTC count.

FIGS. 5A and 5B are timing diagrams of dynamic error correction of the system timer 130 of FIGS. 1 and 3 during an example operation where a frequency of the reference clock (LFCLK) of FIG. 2 is reduced. In the examples of FIGS. 5A and 5B, the timing diagrams illustrate operations of the system timer 130 when the clock controller circuitry 110 of FIGS. 1 and 2 modifies the frequency of the reference clock during operations of the system clock counter circuitry 170 of FIGS. 1 and 3.

FIG. 5A is a timing diagram 500 illustrating a decrease in the frequency of the reference clock. For example, the controller 230 of FIG. 2 modifying the reference clock by changing the multiplexer 225 of FIG. 2 from suppling the first crystal oscillator circuitry 220 of FIG. 2 to supplying the second oscillator 215 of FIG. 2. In such an example, the reference clock count from the counter circuitry 245 of FIG. 2 increases in response to counting more cycles of the clock from the second crystal oscillator circuitry 240 in a cycle of the reference clock. In the example of FIG. 5A, the timing diagram 500 illustrates a decrease in the frequency of the reference clock as an increase in a duration of time represented by the reference count. The timing diagram 500 illustrates a reference clock period 510 across time. The reference clock period 510 represents a cycle of the reference clock as a duration of time in microseconds ($\mu S$). The reference clock count increases as the frequency of the reference clock decreases.

At a first time 520, the reference clock period 510 increases. At the first time 520, the controller 230 may modify the multiplexer 225 to decrease the frequency of the reference clock. Alternatively, the frequencies of the second oscillator 215 and/or the first crystal oscillator circuitry may be modified to decrease the frequency of the reference clock. At a second time 530, the reference clock period 510 settles at approximately twenty-nine and three tenths microseconds ($\mu S$) representing the frequency of the reference clock being approximately thirty-four kilohertz (kHz).

FIG. 5B is a timing diagram 540 illustrating operations of the system timer count circuitry 170 in response to a decrease in the frequency of the reference clock illustrated in the timing diagram 500 of FIG. 5A. In the example of FIG. 5A, the timing diagram 540 illustrates the total error count ($PI_{OUT}$) 550 determined by the controller 330 of FIG. 3 across the example operation of the timing diagram 500 of FIG. 5A. The total error count 550 is determined using Equation (1), above. The total error count 550 is determined based on the synchronized clock from the synchronizer circuitry 335 of FIG. 3 of a frequency approximately equal to the synchronized reference clock from the clock controller circuitry 110 of FIGS. 1 and 2. The synchronized clock is generated by synchronizing edges of the synchronized reference clock to edges of the system clock from the clock controller circuitry 110.

At a third time 560, the total error count 550 increases beyond the first threshold value. The third time 560 corresponds to the increase in the reference clock period 510 at the first time 520. At the third time 560, the controller 330 decrements the pre-scaler value to correct for the total error count 550 being smaller than the second threshold, however the total error count 550 continues to increase in response to the RTC circuitry 120 incrementing using the reference clock count corresponding to the reduced reference clock frequency.

At a fourth time 570, the total error count 550 begins to decrease as the controller 330 continues to decrement the pre-scaler value. At the fourth time 570, the system clock count begins to catch up to the RTC count in response to the controller 330 suppling a pre-scaler value to the clock divider 305 of FIG. 3, which increases rate of the incrementing the counter circuitry 310 of FIG. 3.

At a fifth time 580, the total error count 550 beings to increase as the controller 330 corrects for the accumulated error ($Acc_{error}$) of the total error count calculation of Equation (1), above. The controller 330 corrects the accumulated error from between the third time 560 and the fifth time 580 by reducing the latched count difference. The time between the third time 560 and the fifth time 580 may be reduced by modifying the proportional gain and the integral gain of Equation (1), above. For example, increasing the proportional gain decreases the duration of time needed to settle the total error count 550. Advantageously, the controller 330 dynamically corrects the total error count 550 using Equation (1), above.

Figure 6B:
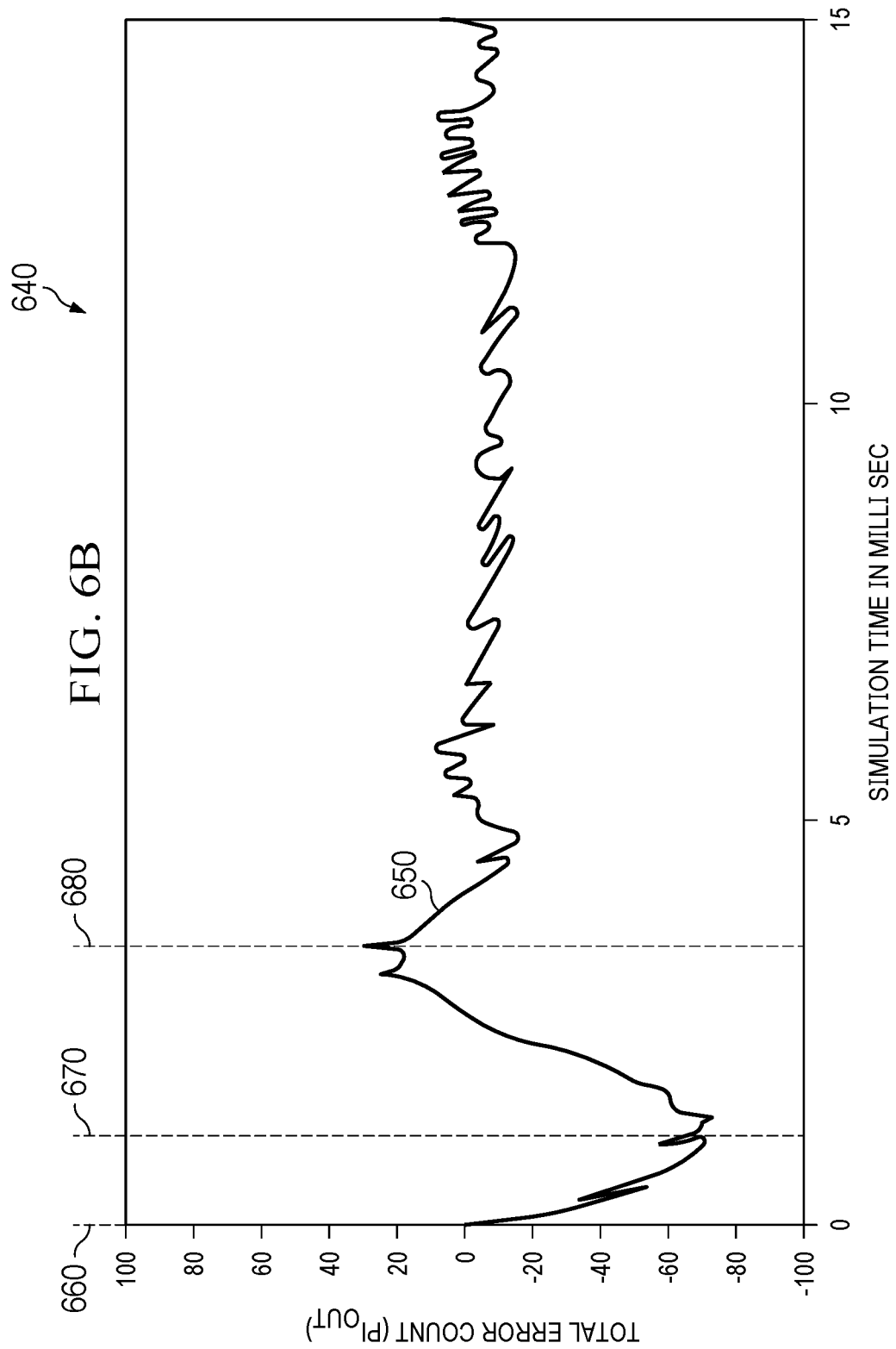

FIGS. 6A and 6B are timing diagram of dynamic error correction of the system timer 130 of FIGS. 1 and 3 during an example operation where a frequency of the reference clock (LFCLK) of FIG. 2 is increased. In the examples of FIGS. 6A and 6B, the timing diagrams illustrate operations of the system timer 130 when the clock controller circuitry 110 of FIGS. 1 and 2 modifies the frequency of the reference clock during operations of the system clock counter circuitry 170 of FIGS. 1 and 3.

FIG. 6A is a timing diagram 600 illustrating an increase in the frequency of the reference clock. For example, the controller 230 of FIG. 2 modifying the reference clock by changing the multiplexer 225 of FIG. 2 from suppling the second oscillator 215 of FIG. 2 to suppling the first crystal oscillator circuitry 220 of FIG. 2. In such an example, the reference clock count from the counter circuitry 245 of FIG. 2 decreases in response to counting less cycles of the clock from the second crystal oscillator circuitry 240 in a cycle of the reference clock. In the example of FIG. 6A, the timing diagram 600 illustrates an increase in the frequency of the reference clock as a decrease in a duration of time represented by the reference count. The timing diagram 600 illustrates a reference clock period 610 across time. The reference clock period 610 represents a cycle of the reference clock as a duration of time in microseconds (µS). The reference clock count decreases as the frequency of the reference clock increases.

At a first time 620, the reference clock period 610 begins to decrease. At the first time 620, the controller 230 may modify the multiplexer 225 to increase the frequency of the reference clock. Alternatively, the frequencies of the second oscillator 215 and/or the first crystal oscillator circuitry may be modified to increase the frequency of the reference clock. At a second timer 630, the reference clock period 610 settles at approximately thirty-one and eight tenths microseconds (µS) representing the frequency of the reference clock being approximately thirty-one kilohertz (kHz).

FIG. 6B is a timing diagram 640 illustrating operations of the system timer count circuitry 170 in response to an increases in the frequency of the reference clock illustrated in the timing diagram 600 of FIG. 6A. In the example of FIG. 6A, the timing diagram 640 illustrates the total error count ($PI_{OUT}$) 650 determined by the controller 330 of FIG. 3 across the example operation of the timing diagram 600 of FIG. 6A. The total error count 650 is determined using Equation (1), above. The total error count 650 is determined based on the synchronized clock from the synchronizer circuitry 335 of FIG. 3 of a frequency approximately equal to the synchronized reference clock from the clock controller circuitry 110 of FIGS. 1 and 2. The synchronized clock is generated by synchronizing edges of the synchronized reference clock to edges of the system clock from the clock controller circuitry 110.

At a third time 660, the total error count 650 decreases beyond the second threshold value. The third time 660 corresponds to the increase in the reference clock period 610 at the first time 620. At the third time 660, the controller 330 decrements the pre-scaler value to correct for the total error count 650 being less than the second threshold, however the total error count 650 continues to increase in response to the RTC circuitry 120 incrementing using the reference clock count corresponding to the reduced reference clock.

At a fourth time 670, the total error count 650 begins to increase as the controller 330 continues to decrement the pre-scaler value. At the fourth time 670, the system clock count begins to catch up to the RTC count in response to the controller 330 suppling a pre-scaler value to the clock divider 305 of FIG. 3, which increases rate of the incrementing the counter circuitry 310 of FIG. 3.

At a fifth time 680, the total error count 650 beings to increase as the controller 330 corrects for the accumulated error ($Acc_{error}$) of the total error count calculation of Equation (1), above. The controller 330 corrects the accumulated error from between the third time 660 and the fifth time 680 by reducing the latched count difference. The time between the third time 660 and the fifth time 680 may be reduced by modifying the proportional gain and the integral gain of Equation (1), above. For example, increasing the proportional gain and decreasing the integral gain decreases the duration of time needed to settle the total error count 650. Advantageously, the controller 330 dynamically corrects the total error count 550 using Equation (1), above.

Figure 7:
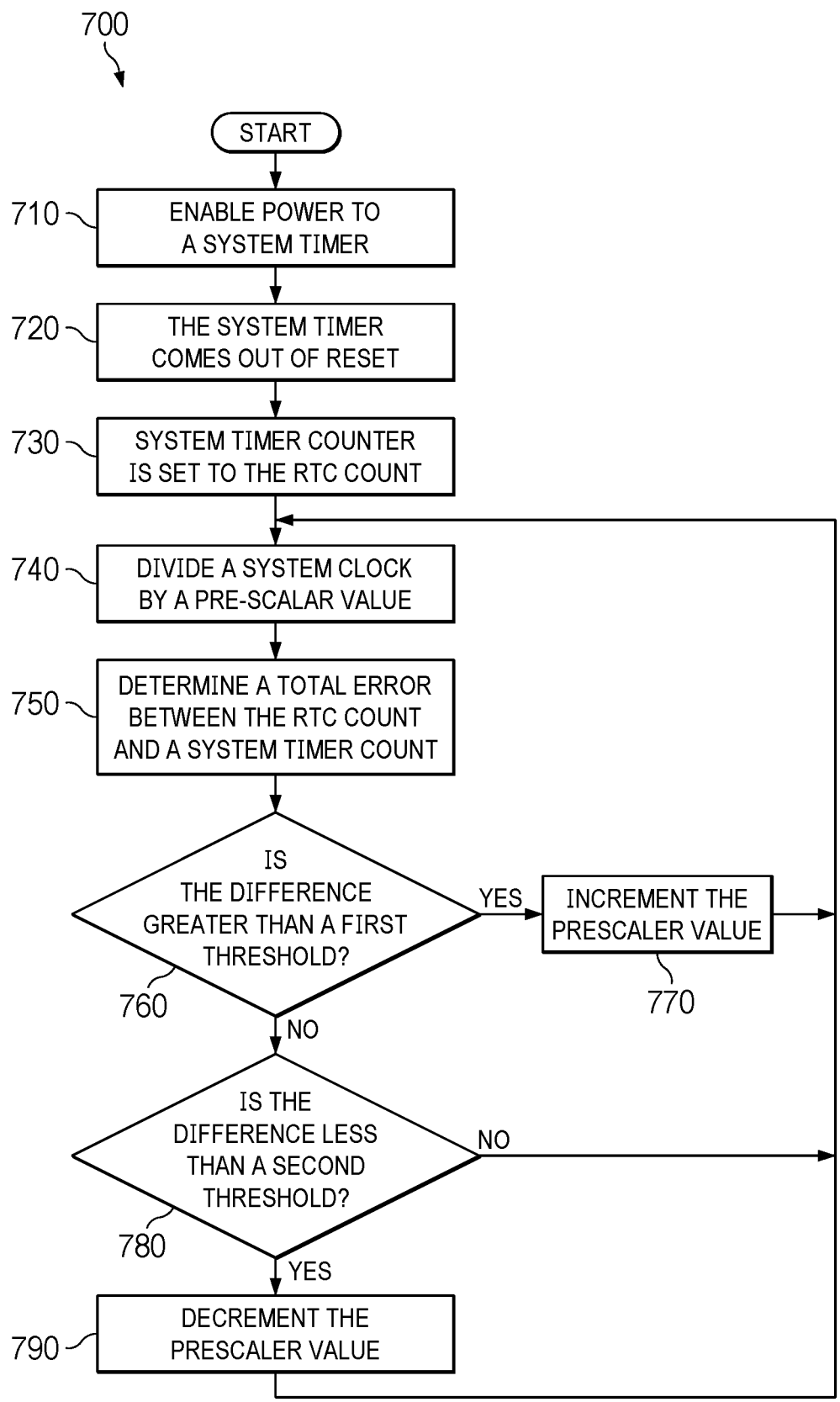
FIG. 7 is a flowchart representative of an example process that may be performed using machine readable instructions that can be executed and/or hardware configured to implement the system timer of FIGS. 1 and 3, and/or, more generally, the timer circuitry of FIG. 1.

FIG. 7 is a flowchart representative of an example process 700 that may be performed using machine readable instructions that can be executed and/or hardware configured to implement the system timer 130 of FIGS. 1 and 3. The process 700 begins at block 710. At block 710, power is supplied to the system timer 130 of FIGS. 1 and 3. The process 700 proceeds to block 720. At block 720, the system timer 130 comes out of reset. The process 700 proceeds to block 730.

At block 730, the system timer count (SYS_TIME) is set to the RTC count (RTC_TIME). For example, the controller 330 configures the multiplexer 350 of FIG. 3 to couple the register 340 of FIG. 3 to the latched RTC count from the first flip-flop 315 of FIG. 3. In such an example, the system timer count is set equal to the latched RTC count. The process 700 proceeds to block 740.

At block 740, the clock divider 305 of FIG. 3 divides the system clock from the clock controller circuitry 110 of FIGS. 1 and 3 by a pre-scaler value from the controller 330. For example, the clock divider 305 divides the system clock of forty-eight megahertz (MHz) by a pre-scaler value of twelve from the controller 330 to supply the counter circuitry 310 of FIG. 3 a divided clock of four megahertz (MHz). The process 700 proceeds to block 750.

At block 750, the comparison circuitry 320 of FIG. 3 determines the total error count between the RTC count and the system timer count using Equation (1), above. For example, the comparison circuitry 320 determines the difference between the latched RTC count from the first flip-flop 315 and the system timer count from the counter circuitry 310. In such an example, the determined difference is supplied to the controller 330 by the second flip-flop 325 based on the synchronized clock from the synchronizer circuitry 335 of FIG. 3. The controller 330 determines the total error count ($PI_{OUT}$) using Equation (1), above, and the difference from the comparison circuitry 320. The process 700 proceeds to block 760.

At block 760, the controller 330 determines whether the difference, determined at block 750, is greater than the first threshold value. For example, the controller 330 compares the determined total error count to the first threshold value. In such an example, the controller 330 determines whether the system timer count is ahead of the RTC count. The process 700 proceeds to block 770 in response to determining the total error count from block 750 is greater than or equal to the first threshold. The process 700 proceeds to block 780 in response to determining the total error count from block 750 is less than the first threshold.

At block 770, the controller 330 increments the pre-scaler value. For example, the controller 330 increments the default pre-scaler value from twelve to thirteen. In such an example, the controller 330 supplies the incremented pre-scaler value to the clock divider 305. The process 700 proceeds to block 740 with the incremented pre-scaler value.

At block 780, the controller 330 determines whether the total error count from block 750 is less than or equal to the second threshold. For example, the controller 330 compares the determined total error count to the second threshold value. In such an example, the controller 330 determines whether the system timer count is behind of the RTC count by the second threshold value or less. The process 700 proceeds to block 790 in response to determining the total error count from block 750 is less than or equal to the second threshold. The process 700 proceeds to block 740 in response to determining the total error count from block 750 is less than the second threshold.

At block 790, the controller 330 decrements the pre-scaler value. For example, the controller 330 decrements the default pre-scaler value from twelve to eleven. In such an example, the controller 330 supplies the decremented pre-scaler value to the clock divider 305. The process 700 proceeds to block 740 with the decremented pre-scaler value.

Figure 8:
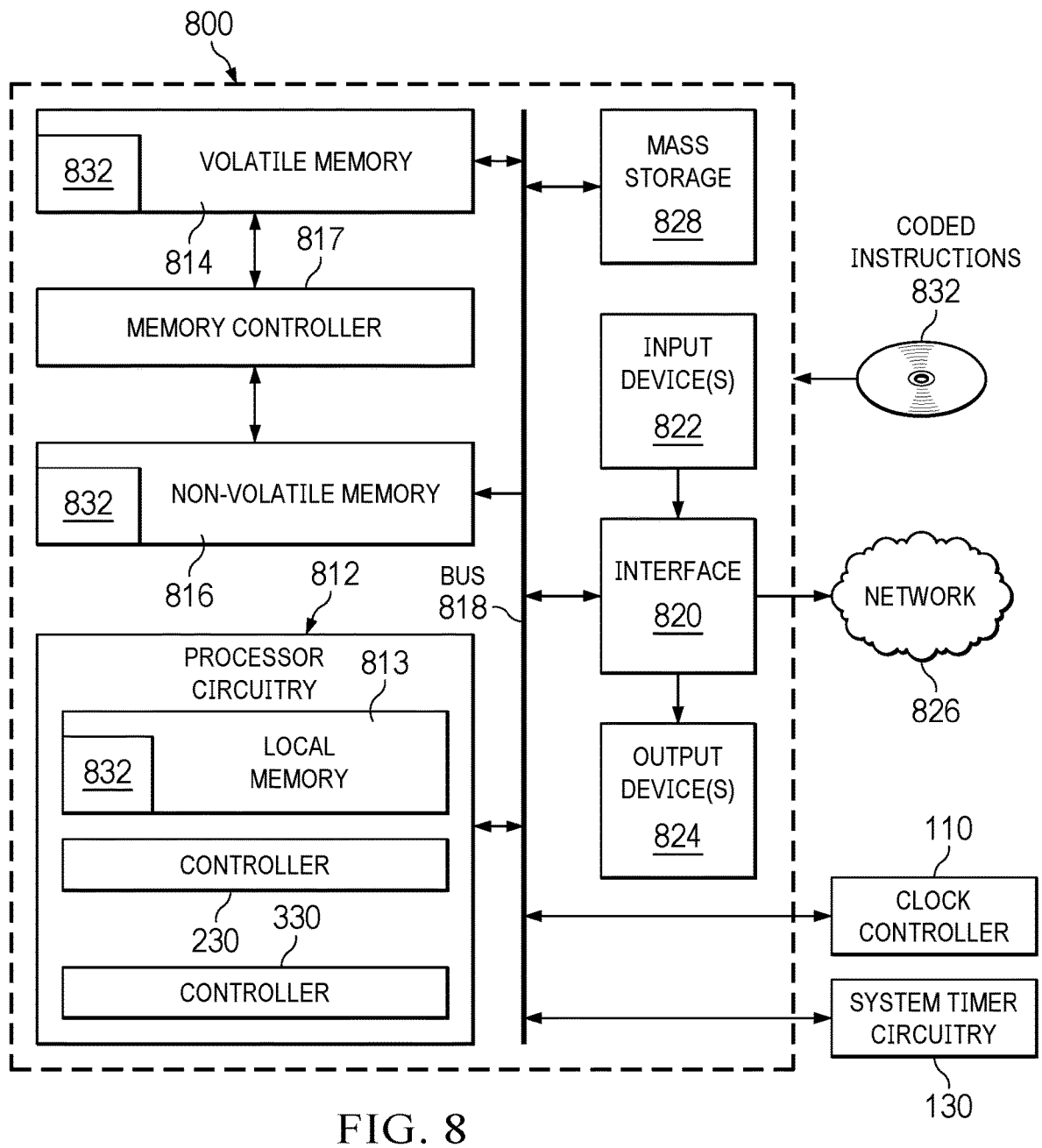
FIG. 8 is a block diagram of an example processing platform including processor circuitry structured to execute the example machine readable instructions and/or the example operations of FIG. 7 to implement the system timer of FIGS. 1 and 3.

FIG. 8 is a block diagram of an example processing platform including processor circuitry structured to execute the example machine readable instructions and/or the example operations of FIG. 7 to implement the controller 230 of FIG. 2 and the controller 330 of FIG. 3. The processor platform 800 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, a headset (e.g., an augmented reality (AR) headset, a virtual reality (VR) headset, etc.) or other wearable device, or any other type of computing device.

The processor platform 800 of the illustrated example includes processor circuitry 812. The processor circuitry 812 of the illustrated example is hardware. For example, the processor circuitry 812 can be implemented by one or more integrated circuits, logic circuits, FPGAs, microprocessors, CPUs, GPUs, DSPs, and/or microcontrollers from any desired family or manufacturer. The processor circuitry 812 may be implemented by one or more semiconductor based (e.g., silicon based) devices. In this example, the processor circuitry 812 implements the controller 230 and the controller 330.

The processor circuitry 812 of the illustrated example includes a local memory 813 (e.g., a cache, registers, etc.). The processor circuitry 812 of the illustrated example is in communication with a main memory including a volatile memory 814 and a non-volatile memory 816 by a bus 818. The volatile memory 814 may be implemented by Synchronous Dynamic Random Access Memory (SDRAM), Dynamic Random Access Memory (DRAM), RAMBUS® Dynamic Random Access Memory (RDRAM®), and/or any other type of RAM device. The non-volatile memory 816 may be implemented by flash memory and/or any other desired type of memory device. Access to the main memory 814, 816 of the illustrated example is controlled by a memory controller 817.

The processor platform 800 of the illustrated example also includes interface circuitry 820. The interface circuitry 820 may be implemented by hardware in accordance with any type of interface standard, such as an Ethernet interface, a universal serial bus (USB) interface, a Bluetooth® interface, a near field communication (NFC) interface, a Peripheral Component Interconnect (PCI) interface, and/or a Peripheral Component Interconnect Express (PCIe) interface.

In the illustrated example, one or more input devices 822 are connected to the interface circuitry 820. The input device(s) 822 permit(s) a user to enter data and/or commands into the processor circuitry 812. The input device(s) 822 can be implemented by, for example, an audio sensor, a microphone, a camera (still or video), a keyboard, a button, a mouse, a touchscreen, a track-pad, a trackball, an isopoint device, and/or a voice recognition system.

One or more output devices 824 are also connected to the interface circuitry 820 of the illustrated example. The output device(s) 824 can be implemented, for example, by display devices (e.g., a light emitting diode (LED), an organic light emitting diode (OLED), a liquid crystal display (LCD), a cathode ray tube (CRT) display, an in-place switching (IPS) display, a touchscreen, etc.), a tactile output device, a printer, and/or speaker. The interface circuitry 820 of the illustrated example, thus, typically includes a graphics driver card, a graphics driver chip, and/or graphics processor circuitry such as a GPU.

The interface circuitry 820 of the illustrated example also includes a communication device such as a transmitter, a receiver, a transceiver, a modem, a residential gateway, a wireless access point, and/or a network interface to facilitate exchange of data with external machines (e.g., computing devices of any kind) by a network 826. The communication can be by, for example, an Ethernet connection, a digital subscriber line (DSL) connection, a telephone line connection, a coaxial cable system, a satellite system, a line-of-site wireless system, a cellular telephone system, an optical connection, etc.

The processor platform 800 of the illustrated example also includes one or more mass storage devices 828 to store software and/or data. Examples of such mass storage devices 828 include magnetic storage devices, optical storage devices, floppy disk drives, HDDs, CDs, Blu-ray disk drives, redundant array of independent disks (RAID) systems, solid state storage devices such as flash memory devices and/or SSDs, and DVD drives.

The machine readable instructions 832, which may be implemented by the machine readable instructions of FIG. 7, may be stored in the mass storage device 828, in the volatile memory 814, in the non-volatile memory 816, and/or on a removable non-transitory computer readable storage medium such as a CD or DVD.

In this description, the term "and/or" (when used in a form such as A, B and/or C) refers to any combination or subset of A, B, C, such as: (a) A alone; (b) B alone; (c) C alone; (d) A with B; (e) A with C; (f) B with C; and (g) A with B and with C. Also, as used herein, the phrase "at least one of A or B" (or "at least one of A and B") refers to implementations including any of: (a) at least one A; (b) at least one B; and (c) at least one A and at least one B.

The term "couple" is used throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal," "node," "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead. For example, a p-type metal-oxide-silicon FET ("MOSFET") may be used in place of an n-type MOSFET with little or no changes to the circuit. Furthermore, other types of transistors may be used (such as bipolar junction transistors (BJTs)).

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value.

Modifications are possible in the described embodiments, and other embodiments are possible, within the scope of the claims.

What is claimed is:

1. A device comprising:
   clock controller circuitry including a first clock output, a second clock output, and a system clock output;
   real-time clock (RTC) circuitry including a first clock input, a second clock input, and an RTC output, the first clock input coupled to the first clock output, the second clock input coupled to the second clock output; and
   a system timer coupled to the clock controller circuitry and the RTC circuitry, the system timer including:
   clock divider circuitry including a third clock input, a divider input, and a divider output, the third clock input coupled to the system clock output;
   counter circuitry including a counter input and a counter output, the counter input coupled to the divider output;
   comparison circuitry including a first input, a second input, and a comparison output, the first input coupled to the counter output, the second input configured to be coupled to the RTC output based on the second clock output; and
   controller circuitry including an error input and a divider output, the error input configured to be coupled to the comparison output, the divider output coupled to the divider input.

2. The device of claim 1, wherein the clock controller circuitry further includes a first oscillator and a second oscillator, the first oscillator configured to generate a reference clock of a first frequency, and the second oscillator configured to generate a system clock of a second frequency, and the first frequency is less than the second frequency.

3. The device of claim 2, wherein the clock divider circuitry is first clock divider circuitry, the clock controller circuitry includes second clock divider circuitry and synchronizer circuitry, the second clock divider circuitry configured to divide the system clock from the second oscillator to generate an ultra-low leakage (ULL) clock, the synchronizer circuitry configured to synchronize the reference clock to the ULL clock.

4. The device of claim 1, wherein the system timer further includes synchronizer circuitry including a reference input, a data input, and a data output, the reference input coupled to the system clock output, the data input coupled to the second clock output, the data output configured to enable the comparison output to be coupled to the error input.

5. The device of claim 4, wherein the synchronizer circuitry includes a two-stage synchronizer configured to enable the RTC output to be coupled to the second input based on an edge of the second clock output.

6. The device of claim 1, wherein the system timer further includes a multiplexer including a first multiplexer input, a second multiplexer input, and a multiplexer output, the first multiplexer input configured to be coupled to the RTC output, the second multiplexer input configured to be coupled to an increment input, and the multiplexer output coupled to the counter circuitry.

7. The device of claim 6, wherein the first multiplexer input is configured to be coupled to the multiplexer output following enabling the system timer and couple the second multiplexer input to the multiplexer output following coupling the first multiplexer input to the multiplexer output until the system timer is disabled.

8. An apparatus comprising:
   clock divider circuitry configured to divide a system clock by a pre-scaler input to generate a divided clock;
   counter circuitry configured to increment a system timer count based on the divided clock;
   comparison circuitry configured to determine a count difference between the system timer count and a real-time clock count; and
   controller circuitry configured to modify the pre-scaler input based on a comparison of the count difference to a threshold value.

9. The apparatus of claim 8, further including synchronizer circuitry configured to enable a first flip-flop to couple the count difference to the controller circuitry based on the system clock and an edge of a clock tick input.

10. The apparatus of claim 8, further including a multiplexer configured to set the system timer count equal to the real-time clock count following a reset and set the system timer count equal to an incremented system timer count following setting the system timer count equal to the real-time clock count.

11. The apparatus of claim 10, further including an adder configured generate the incremented system timer count by incrementing the system timer count by one.

12. The apparatus of claim 8, wherein the threshold value is a first threshold value, and wherein the controller circuitry is further configured to decrement the pre-scaler input in response to determining the count difference is less than or equal to a second threshold value.

13. The apparatus of claim 8, wherein the controller circuitry configured to increment the pre-scaler input in response to determining the count difference is greater than or equal to the threshold value.

14. The apparatus of claim 8, wherein the controller circuitry is configured to determine the count difference by adding a multiplication of a first gain value by an accumulated error to a multiplication of a second gain value by the count difference between the system timer count and the real-time clock count.

15. A method comprising:
   generating, by clock controller circuitry, a system clock and a reference clock;
   dividing, by clock divider circuitry, the system clock by a pre-scaler value to generate a divided system clock;
   counting, by counter circuitry, a system clock count based on the divided system clock;
   determining, by comparison circuitry, an error value between a real-time clock (RTC) count and the system clock count at an edge of the reference clock;
   synchronizing, by synchronizer circuitry, the determination of the error value to a rising edge of the reference clock; and
   modifying, by a controller, the pre-scaler value based on the error value.

16. The method of claim 15, further including incrementing the pre-scaler value in response to determining that the system clock count is greater than the RTC count by a value greater than a threshold value.

17. The method of claim 15, further including decrementing the pre-scaler value in response to determining that the system clock count is less than the RTC count by a value less than a threshold value.

18. The method of claim 15, further including setting the system clock count equal to the RTC count to initialize the system clock count.

19. The method of claim 15, further including generating the RTC count by adding a reference count of cycles of a precision clock in one cycle of the reference clock.

20. The method of claim 15, further including generating the real-time clock count by incrementing the real-time clock count by a reference clock count.

\* \* \* \* \*